US012785433B2

(12) United States Patent
Jiang et al.

(10) Patent No.: US 12,785,433 B2
(45) Date of Patent: Nov. 3, 2026

(54) CHARGING TIME ESTIMATION METHOD AND APPARATUS, AND STORAGE MEDIUM

(71) Applicant: Yinwang Intelligent Technologies Co., Ltd., Shenzhen (CN)

(72) Inventors: Jing Jiang, Shenzhen (CN); Lulu Zheng, Shanghai (CN); Rui Yang, Shanghai (CN)

(73) Assignee: Yinwang Intelligent Technologies Co., Ltd., Shenzhen (CN)

( * ) Notice: Subject to any disclaimer, the term of this patent is extended or adjusted under 35 U.S.C. 154(b) by 1083 days.

(21) Appl. No.: 17/844,964

(22) Filed: Jun. 21, 2022

(65) Prior Publication Data

US 2022/0320872 A1 Oct. 6, 2022

Related U.S. Application Data

(63) Continuation of application No. PCT/CN2020/135061, filed on Dec. 10, 2020.

(30) Foreign Application Priority Data

Dec. 20, 2019 (CN) ........................ 201911330319.X

(51) Int. Cl.
*H02J 7/90* (2026.01)
*B60L 53/62* (2019.01)
(Continued)

(52) U.S. Cl.
CPC ................ *H02J 7/90* (2026.01); *B60L 53/62* (2019.02); *B60L 58/12* (2019.02); *B60L 58/24* (2019.02);
(Continued)

(58) Field of Classification Search
CPC .......... B60L 53/62; B60L 58/12; B60L 58/24; B60L 58/26; B60L 2240/545;
(Continued)

(56) References Cited

U.S. PATENT DOCUMENTS 5,079,716 A * 1/1992 Lenhardt ........... H02J 7/007192 701/1
5,178,206 A * 1/1993 Saunders ........... G05D 23/1923 165/236
(Continued)

FOREIGN PATENT DOCUMENTS

CN 103427137 A 12/2013
CN 104424396 A 3/2015
(Continued)

OTHER PUBLICATIONS

European Search Report for Application No. EP 20901554 dated Jan. 9, 2023, 11 pages.

*Primary Examiner* — Drew A Dunn
*Assistant Examiner* — Frank Alexis Silva
(74) *Attorney, Agent, or Firm* — Leydig, Voit & Mayer, Ltd.

(57) ABSTRACT

The technology of this application relates to a charging time estimation method and apparatus, and a storage medium. The method includes obtaining a current temperature of a to-be-charged device and a current state of charge (SOC) of the to-be-charged device in a calculation period, and obtaining a required current of the to-be-charged device based on the current temperature and the current state of charge. The method further includes determining a charging current of the to-be-charged device and obtaining a charging time. The method can be applied to a thermal management system of an electric vehicle or an optimization model of an off-line thermal management strategy.

20 Claims, 12 Drawing Sheets

(51) Int. Cl.
*B60L 58/12* (2019.01)
*B60L 58/24* (2019.01)
*G01R 31/374* (2019.01)
*G01R 31/3842* (2019.01)

(52) U.S. Cl.
CPC ....... *G01R 31/374* (2019.01); *G01R 31/3842* (2019.01)

(58) Field of Classification Search
CPC ........... B60L 2240/549; B60L 2260/50; B60L 2260/56; G01R 31/374; G01R 31/3842; H02J 7/007; Y02T 10/70
USPC .......................................................... 320/145
See application file for complete search history.

(56) References Cited

U.S. PATENT DOCUMENTS 5,188,465 A * 2/1993 Johnson ..................... B41J 2/30 101/93.29
5,241,855 A * 9/1993 Cullen ................ G01M 15/042 73/114.15
5,268,835 A * 12/1993 Miyagaki ........... G05B 13/0285 706/900
5,565,759 A * 10/1996 Dunstan .................. H02J 7/005 320/152
5,619,433 A * 4/1997 Wang ................... G09B 25/025 703/18
6,011,380 A * 1/2000 Paryani ................... B60L 58/27 320/132
6,138,466 A * 10/2000 Lake .................. B60H 1/00392 62/238.7
6,300,763 B1 * 10/2001 Kwok ................... H01M 10/44 320/132
6,404,163 B1 * 6/2002 Kapsokavathis ... H02J 7/00302 320/104
6,724,172 B2 * 4/2004 Koo ........................ H02J 7/855 320/128
7,078,877 B2 * 7/2006 Salasoo ................. H02J 7/0014 320/104
7,147,071 B2 * 12/2006 Gering ..................... B60H 1/08 165/41
7,244,905 B2 * 7/2007 Das ...................... B23K 11/256 219/109
7,389,159 B2 * 6/2008 Warren .............. G05D 23/1924 713/320
7,405,537 B2 * 7/2008 Hoffman .............. G01R 31/367 320/132
7,550,946 B2 * 6/2009 Zettel ...................... B60L 58/25 320/132
7,598,712 B2 * 10/2009 Zettel ................... G01R 31/374 320/132
7,622,897 B2 * 11/2009 Eberhard ................ B60L 58/12 320/152
7,629,772 B2 * 12/2009 Eberhard ................ B60L 50/51 320/152
7,629,773 B2 * 12/2009 Eberhard .............. B60L 3/0046 320/152
7,671,567 B2 * 3/2010 Eberhard ................ B60L 58/12 320/152
7,755,329 B2 7/2010 Kohn et al.
7,904,287 B2 * 3/2011 Lefurgy .............. G06F 11/3476 703/21
7,911,184 B2 * 3/2011 Kohn ...................... B60L 1/003 701/22
7,920,441 B2 * 4/2011 Rostrom ................. G01S 19/24 368/14
7,928,699 B2 * 4/2011 Kohn ...................... B60L 58/12 307/31
8,095,326 B2 * 1/2012 Berggren ............ H02J 13/0004 702/77
8,197,386 B2 * 6/2012 Capito ............... B60K 23/0808 477/70
8,350,526 B2 * 1/2013 Dyer ....................... B60L 55/00 320/109
8,401,833 B2 * 3/2013 Radibratovic ......... G06Q 10/04 703/2
8,529,125 B2 * 9/2013 Leutheuser ......... H01M 10/443 374/163
8,548,761 B2 * 10/2013 Lim ........................ B60L 58/12 324/426
8,548,762 B2 * 10/2013 Prada ................. G01R 31/3842 702/182
8,620,506 B2 * 12/2013 Kummer ................. B60L 58/12 180/65.21
8,624,169 B1 * 1/2014 Sorenson ............ A47J 37/0709 99/333
8,754,611 B2 * 6/2014 Greening ................ H02J 7/007 429/61
8,781,658 B2 * 7/2014 Simonini ................ B60L 58/27 324/426
8,810,584 B2 * 8/2014 Kabawala ............... G06F 9/505 345/502
9,071,071 B2 * 6/2015 Greening .............. H01M 10/44
9,181,953 B2 * 11/2015 Steger ................. F04D 15/0066
9,296,302 B2 * 3/2016 Birke ...................... B60L 53/00
9,318,778 B2 * 4/2016 Wahlstrom ............... G01K 7/42
9,340,114 B2 * 5/2016 Ferrel ..................... B60L 50/16
9,435,249 B2 * 9/2016 Ruby ...................... G16Z 99/00
9,457,682 B2 * 10/2016 Twarog ............... H01M 10/443
9,608,280 B2 * 3/2017 Kinoshita ............... B60L 58/12
9,709,444 B2 * 7/2017 Nozawa ................ B60W 20/50
9,720,487 B2 * 8/2017 Bircher ................... G06F 1/329
9,786,961 B2 * 10/2017 Dyer ..................... B60L 53/302
9,812,210 B2 * 11/2017 Zeng .................. G11C 16/3495
9,817,074 B1 * 11/2017 Li ........................ G01R 31/367
9,821,668 B2 * 11/2017 Kusch ..................... B60L 58/12
9,905,893 B2 * 2/2018 Walker ................ H01M 10/615
9,937,817 B2 * 4/2018 Niwa ...................... B60L 53/24
9,955,296 B2 * 4/2018 Yau Fung Pun ...... H04W 4/021
9,966,753 B2 * 5/2018 Kobayashi ............... H01H 9/56
9,987,944 B2 * 6/2018 Dunlap ..................... B60L 1/02
10,044,210 B2 * 8/2018 Greening ................ H02J 7/007
10,059,222 B2 * 8/2018 He .......................... B60L 58/26
10,099,562 B2 * 10/2018 Jin ....................... G01R 31/382
10,164,450 B2 * 12/2018 Masias .................... B60L 53/62
10,286,808 B2 * 5/2019 Park ........................ B60L 58/27
10,295,610 B2 * 5/2019 Kagami ................... B60L 58/16
10,427,491 B2 * 10/2019 Johnston ................ B60H 1/323
10,434,892 B2 * 10/2019 Ko .......................... B60L 53/66
10,675,983 B2 * 6/2020 Bryngelsson ........... B60L 58/12
10,780,786 B2 * 9/2020 Del Core ............ H01M 10/613
10,857,887 B2 * 12/2020 Epstein ................... B60L 3/003
10,953,726 B2 * 3/2021 Carlson ............. H01M 10/6571
11,040,624 B2 * 6/2021 Jin ........................ G01R 31/36
11,117,491 B2 * 9/2021 Fukami ................. B60L 53/665
11,152,653 B2 * 10/2021 Carlson ............... H01M 10/613
11,211,803 B2 * 12/2021 Bunnell .................. B60L 58/13
11,269,011 B2 * 3/2022 Ruan .................... G01R 31/367
11,273,726 B2 * 3/2022 Sato ...................... H02J 7/0024
11,305,659 B2 * 4/2022 Kim .................... H01M 10/613
11,318,852 B2 * 5/2022 Kusch ..................... B60L 58/26
11,362,380 B2 * 6/2022 Choi ..................... H01M 10/44
11,472,312 B2 * 10/2022 Kusada ................... B60L 58/27
11,486,935 B2 * 11/2022 Behrendt ........... G01R 31/3842
11,498,451 B2 * 11/2022 Wu .................... G01R 31/3648
11,515,587 B2 * 11/2022 Stewart ............. H02J 7/007194
11,518,271 B2 * 12/2022 Okamoto ................ B60L 53/20
11,567,503 B1 * 1/2023 Roy ....................... G05D 1/028
11,588,437 B2 * 2/2023 Roy ........................ H02J 3/381
11,590,855 B2 * 2/2023 Wainwright ............ B60L 58/26
11,594,769 B2 * 2/2023 Austin .................. B60L 53/305
11,600,867 B2 * 3/2023 Austin .................... B60L 53/14
11,846,676 B2 * 12/2023 Sun ....................... H02J 7/0047
11,929,468 B2 * 3/2024 Lim ........................ B60L 53/62
12,005,810 B2 * 6/2024 Jin .......................... B60L 50/60
12,071,041 B2 * 8/2024 Ohtomo .................. B60L 53/62
12,218,531 B2 * 2/2025 Ogasawara ........ G01R 31/3842
12,571,637 B2 * 3/2026 Gloceri ...................... B60L 1/00
12,606,051 B2 * 4/2026 Kobashi .................. B60L 58/12
12,614,917 B2 * 4/2026 Li ......................... H01M 10/44

(56) References Cited

U.S. PATENT DOCUMENTS

2006/0132092 A1* 6/2006 Hoffman .............. G01R 31/367 320/132
2006/0232240 A1* 10/2006 Salasoo .................. B60L 58/26 320/119
2006/0278616 A1* 12/2006 Das ...................... B23K 11/256 219/109
2007/0213876 A1* 9/2007 Warren .............. G05D 23/1924 237/81
2007/0285059 A1* 12/2007 Zettel .................... B60W 10/26 320/132
2007/0285061 A1* 12/2007 Zettel ................... G01R 31/392 320/132
2008/0074950 A1* 3/2008 Rostrom ................ G04R 20/04 368/10
2008/0196962 A1* 8/2008 Capito ............... B60K 23/0808 192/82 T
2009/0112495 A1* 4/2009 Center ................. G01R 31/392 903/903
2009/0125293 A1* 5/2009 Lefurgy .............. G06F 11/3447 703/18
2009/0140698 A1* 6/2009 Eberhard ................ B60L 58/16 320/152
2009/0140700 A1* 6/2009 Eberhard ................ B60L 58/27 320/162
2009/0143929 A1* 6/2009 Eberhard .............. B60L 3/0046 903/907
2009/0167254 A1* 7/2009 Eberhard ................ B60L 50/51 320/152
2009/0256528 A1* 10/2009 Greening ............ H01M 10/443 429/61
2010/0019718 A1* 1/2010 Salasoo .................. B60L 58/15 320/128
2010/0049494 A1* 2/2010 Radibratovic ......... G06Q 10/04 703/13
2010/0072954 A1* 3/2010 Kohn ................ H02J 7/007194 320/152
2010/0088048 A1* 4/2010 Berggren ............ H02J 13/0004 702/77
2010/0089669 A1 4/2010 Taguchi
2010/0134073 A1* 6/2010 Kohn ...................... B60L 58/12 320/152
2010/0138092 A1* 6/2010 Kohn ...................... B60L 58/12 701/22
2010/0283471 A1* 11/2010 Lim ........................ B60L 58/12 324/427
2011/0054816 A1* 3/2011 Prada ................... G01R 31/367 702/63
2011/0060539 A1* 3/2011 Sciarretta .......... H01M 10/4285 702/63
2011/0081255 A1* 4/2011 Steger ................. F04D 15/0066 417/44.1
2011/0129716 A1* 6/2011 Chung ................ H01M 50/204 429/120
2011/0152856 A1* 6/2011 Govari ............... A61B 18/1492 606/41
2011/0299564 A1* 12/2011 Leutheuser ............ G01K 7/427 374/134
2011/0316486 A1 12/2011 Inaba et al.
2012/0041855 A1* 2/2012 Sterling .................. B60L 53/52 320/109
2012/0083927 A1* 4/2012 Nakamura ............... F24F 11/64 700/278
2012/0109433 A1* 5/2012 Simonini .................. B60L 1/02 701/22
2012/0130655 A1* 5/2012 Mitsuda ............... G01R 31/392 702/58
2012/0136535 A1* 5/2012 Buford .................... B60L 58/33 701/36
2012/0275101 A1* 11/2012 Johnson ............. G01R 31/3842 324/426
2012/0278029 A1* 11/2012 Touzelbaev .............. G01K 7/42 702/130
2013/0063450 A1* 3/2013 Kabawala ............... G06F 9/505 345/502
2013/0066573 A1* 3/2013 Bond .................. G01R 31/392 324/426
2013/0162027 A1 6/2013 Yamamoto et al.
2013/0164573 A1* 6/2013 Williams ................ B60L 58/12 429/50
2013/0166119 A1* 6/2013 Kummer ............. H01M 10/625 701/22
2013/0187446 A1* 7/2013 Ferrel ..................... B60L 50/16 307/9.1
2013/0211650 A1* 8/2013 Tashiro ................. B60W 10/06 180/65.265
2013/0221919 A1* 8/2013 Gallegos ............... B60L 3/0092 320/109
2013/0288089 A1* 10/2013 Kinoshita ........... H01M 10/486 429/62
2013/0297255 A1* 11/2013 Kobayashi ........... H01H 33/593 702/179
2014/0002032 A1* 1/2014 Frampton ................. H02J 9/00 322/44
2014/0012447 A1* 1/2014 Gao ........................ B60L 58/13 701/22
2014/0067297 A1* 3/2014 Prada .................. H01M 10/486 702/63
2014/0091772 A1* 4/2014 Del Core ................ B60L 58/26 320/167
2014/0174707 A1* 6/2014 Lombardo ................ B60L 1/04 165/202
2014/0197805 A1* 7/2014 Greening .......... H01M 10/0525 320/162
2014/0217976 A1* 8/2014 McGrath ............. B60L 15/2045 320/109
2015/0066837 A1* 3/2015 Twarog ................... B60L 58/12 706/58
2015/0168975 A1* 6/2015 Loucks .................. G05B 15/02 700/296
2015/0198991 A1* 7/2015 Bircher ................... G06F 1/329 713/323
2015/0236523 A1* 8/2015 Takano ................... B60L 53/14 702/63
2015/0280294 A1* 10/2015 Shin ........................ B60L 58/26 429/50
2015/0291055 A1* 10/2015 He .......................... B60L 58/12 165/41
2015/0300239 A1* 10/2015 Ruby ....................... F01P 11/14 701/99
2015/0362923 A1* 12/2015 Westervelt ............. G05B 15/02 700/289
2016/0009188 A1* 1/2016 Yokoyama .............. B60L 1/003 701/1
2016/0014695 A1* 1/2016 Ehsan ....................... H04L 5/14 370/311
2016/0052410 A1* 2/2016 Zhou ....................... B60L 58/20 320/109
2016/0064971 A1* 3/2016 Dai ....................... H02J 7/0013 320/162
2016/0079633 A1* 3/2016 Wahlstrom .......... H01M 10/625 429/82
2016/0087461 A1* 3/2016 Greening .............. H01M 50/00 320/107
2016/0107526 A1* 4/2016 Jin ............................ B60L 7/10 307/10.1
2016/0155278 A1* 6/2016 Nozawa ................. B60K 6/445 701/22
2016/0207417 A1* 7/2016 Gauthier ................. B60L 58/27
2016/0209474 A1* 7/2016 Chiu ..................... H02J 7/0048
2016/0276843 A1* 9/2016 Chang ................. H02J 7/00714
2016/0347302 A1 12/2016 Niwa et al.
2017/0010332 A1* 1/2017 Kagami ............... G01R 31/374
2017/0018923 A1* 1/2017 Rombouts .............. G06Q 50/06
2017/0088007 A1* 3/2017 Melendez ............. B60L 53/302
2017/0199249 A1* 7/2017 Novak ................. G01R 31/367
2017/0201953 A1* 7/2017 Yau Fung Pun ...... H04W 4/021
2017/0232865 A1* 8/2017 Christen ............ B60H 1/00278 429/120

(56) References Cited

U.S. PATENT DOCUMENTS

| | | | | |
|---|---|---|---|---|
| 2017/0234934 | A1* | 8/2017 | Zhong | G01R 31/3835 702/63 |
| 2017/0271020 | A1* | 9/2017 | Zeng | G11C 16/3495 |
| 2017/0297431 | A1* | 10/2017 | Epstein | F02N 19/10 |
| 2017/0361729 | A1* | 12/2017 | Bryngelsson | B60L 53/00 |
| 2018/0029483 | A1* | 2/2018 | Del Core | B60L 50/40 |
| 2018/0040384 | A1* | 2/2018 | Lazarov | G11C 29/50016 |
| 2018/0058769 | A1* | 3/2018 | Bidner | F28F 27/00 |
| 2018/0080995 | A1* | 3/2018 | Heinen | G01R 31/44 |
| 2018/0106866 | A1* | 4/2018 | Tan | H01M 10/4257 |
| 2018/0115029 | A1* | 4/2018 | Ren | B60L 58/26 |
| 2018/0134170 | A1* | 5/2018 | Zhou | B60L 58/21 |
| 2018/0170207 | A1 | 6/2018 | Ko | |
| 2018/0170208 | A1 | 6/2018 | Park | |
| 2018/0175637 | A1* | 6/2018 | Zhang | H02J 7/0068 |
| 2018/0320967 | A1* | 11/2018 | Kaloudis | G01N 27/4162 |
| 2018/0340983 | A1* | 11/2018 | Li | G01R 31/3842 |
| 2019/0047421 | A1* | 2/2019 | Jin | B60L 7/10 |
| 2019/0207406 | A1* | 7/2019 | Matthey | H02J 7/00309 |
| 2019/0257891 | A1* | 8/2019 | Kim | G01R 31/392 |
| 2019/0263220 | A1* | 8/2019 | Bidner | F28D 20/026 |
| 2019/0285312 | A1* | 9/2019 | Goodjohn | F24H 9/2021 |
| 2020/0023750 | A1* | 1/2020 | Fukami | B60L 58/25 |
| 2020/0132774 | A1* | 4/2020 | Hara | H02J 7/0048 |
| 2020/0207233 | A1* | 7/2020 | Sato | B60L 58/18 |
| 2020/0231060 | A1* | 7/2020 | Matsuyama | B60L 53/62 |
| 2020/0238850 | A1* | 7/2020 | Kusada | B60L 58/27 |
| 2020/0317072 | A1* | 10/2020 | Kim | B60L 53/302 |
| 2020/0338959 | A1* | 10/2020 | Carlson | H01M 10/615 |
| 2020/0338998 | A1* | 10/2020 | Wainwright | B60L 58/26 |
| 2020/0343601 | A1* | 10/2020 | Carlson | B60L 58/26 |
| 2020/0361332 | A1* | 11/2020 | Rieger | B60L 58/13 |
| 2020/0386824 | A1* | 12/2020 | Behrendt | B60L 58/15 |
| 2021/0070180 | A1* | 3/2021 | Del Core | B60L 58/27 |
| 2021/0101504 | A1* | 4/2021 | Okamoto | H02J 7/04 |
| 2021/0111446 | A1* | 4/2021 | Stewart | H01M 10/0525 |
| 2021/0170881 | A9* | 6/2021 | Jin | G01R 31/36 |
| 2021/0178931 | A1* | 6/2021 | Ohtomo | G01K 13/02 |
| 2021/0273270 | A1* | 9/2021 | Fujikawa | B60L 50/60 |
| 2021/0309111 | A1* | 10/2021 | Jin | G01R 31/382 |
| 2021/0325466 | A1* | 10/2021 | Ruan | G01R 31/367 |
| 2022/0006314 | A1* | 1/2022 | Lim | H02J 7/00714 |
| 2022/0140640 | A1* | 5/2022 | Li | H02J 7/007194 320/153 |
| 2022/0203863 | A1* | 6/2022 | Wu | G01R 31/3648 |
| 2022/0291286 | A1* | 9/2022 | Narimoto | G01R 31/374 |
| 2022/0308114 | A1* | 9/2022 | Sun | G01R 31/382 |
| 2022/0320875 | A1* | 10/2022 | Ogasawara | G01R 31/374 |
| 2022/0374568 | A1* | 11/2022 | Baumann | G06F 30/20 |
| 2023/0025958 | A1* | 1/2023 | Deng | H01M 10/6554 |
| 2023/0131786 | A1* | 4/2023 | Del Core | B60L 58/40 320/136 |

FOREIGN PATENT DOCUMENTS

| | | | |
|---|---|---|---|
| CN | 106100067 | A | 11/2016 |
| CN | 106183844 | A | 12/2016 |
| CN | 205790267 | U | 12/2016 |
| CN | 107145649 | A | 9/2017 |
| CN | 108172930 | A | 6/2018 |
| CN | 109466372 | A | 3/2019 |
| CN | 109599607 | A | 4/2019 |
| CN | 109980312 | A | 7/2019 |
| CN | 110109024 | A | 8/2019 |
| CN | 110146816 | A | 8/2019 |
| CN | 110435478 | A | 11/2019 |
| CN | 111055722 | A | 4/2020 |
| JP | 2006304572 | A | 11/2006 |
| JP | 2010262879 | A | 11/2010 |
| JP | 2014171345 | A | 9/2014 |

* cited by examiner

CHARGING TIME ESTIMATION METHOD AND APPARATUS, AND STORAGE MEDIUM

CROSS-REFERENCE TO RELATED APPLICATIONS

This application is a continuation of International Application No. PCT/CN2020/135061, filed on Dec. 10, 2020, which claims priority to Chinese Patent Application No. 201911330319.X, filed on Dec. 20, 2019. The disclosures of the aforementioned applications are hereby incorporated by reference in their entireties.

TECHNICAL FIELD

This application relates to the electric vehicle charging field, and in particular, to an electric vehicle charging time estimation method and apparatus, and a storage medium.

BACKGROUND

With aggravation of an energy shortage and environmental pollution in the modern society, as new energy vehicles, electric vehicles have received widespread attention. An electric vehicle drives by using an in-vehicle power battery as energy to drive the vehicle. As performance of the vehicle improves and a pace of life accelerates, users become more sensitive to a charging time. Usually, after a charging gun is plugged in, the user sets a charging target value, and then reads a remaining charging time through an instrument panel, and the user arranges corresponding activities based on the charging time. Therefore, accurate charging time is of great importance to user experience. Especially in a fast charging scenario, a user's requirement for charging is to reach a preset charging end condition at a fastest speed.

However, a charging current is greatly affected by a battery temperature. To ensure charging safety and prevent lithium from being charged and precipitated at a low temperature, the charging current is usually only 0.2 C. In a proper temperature range of 25° C. to 35° C., a sustainable charging current can reach 2 C to 3 C. Therefore, to speed up the charging speed, a thermal management system is required to heat or cool the battery to the most suitable temperature range for fast charging.

During fast charging, the charging speed of the electric vehicle is usually 2 C to 3 C. (C indicates a charge/discharge ratio. C=charging/discharging current/rated capacity. For example, if a battery with a rated capacity of 50 Ah is charged with a current of 150 A, a charge ratio of the battery is 3 C). For a large-capacity battery, heat generation is very large, and the battery temperature needs to be managed in a proactive thermal management manner. The thermal management system affects the battery temperature. This changes the sustainable charging current of the battery, and further affects the charging time. In addition, the thermal management system consumes a part of the power. This also leads to uncertainty about the charging time. Therefore, estimation of a working state of the thermal management system is very important for estimation of the charging time. However, currently, a remaining time of a charging process of the electric vehicle is estimated based only on a current battery voltage and the battery temperature. Impact of the thermal management system on the battery charging time in a future charging process is not considered. As a result, an error between the estimated remaining charging time and an actual charging time is large, and user experience is affected.

SUMMARY

Embodiments of this application provide a charging time estimation method and apparatus, and a storage medium.

The following describes this application from a plurality of aspects. It is easy to understand that implementations of the plurality of aspects may be mutually referenced.

According to a first aspect, an embodiment of this application provides a charging time estimation method, including: obtaining a current temperature of a to-be-charged device and a current state of charge (SOC) of the to-be-charged device in a calculation period; obtaining a required current of the to-be-charged device based on the current temperature and the current state of charge; determining a charging current of the to-be-charged device based on a charging device current, the required current of the to-be-charged device, and a required current of a thermal management system; and obtaining a charging time based on a remaining state of charge of the to-be-charged device and the charging current, where the remaining state of charge is obtained based on the current state of charge. In this method, energy consumption of the thermal management system is estimated in a charging process, so as to resolve a problem that the energy consumption of the thermal management system is not considered in the conventional charging time estimation method, to make the estimated charging time more accurate.

According to the first aspect, in a possible implementation, the determining a charging current of the to-be-charged device based on a charging device current, the required current of the to-be-charged device, and a required current of a thermal management system includes: When the charging device current is greater than or equal to a sum of the required current of the to-be-charged device and the required current of the thermal management system, determining that the charging current of the to-be-charged device is the required current of the to-be-charged device; or when the charging device current is less than a sum of the required current of the to-be-charged device and the required current of the thermal management system, determining that the charging current of the to-be-charged device is a difference between the charging device current and a distribution current of the thermal management system, where the distribution current of the thermal management system is K×the charging device current, and $0<K\leq 1$. According to the charging time estimation method provided in this application, whether a capability of a charging pile can meet the required current of the to-be-charged device and the required current of the thermal management system is considered, so that the estimated charging time is accurate and reliable.

According to the first aspect, in a possible implementation, the obtaining a current temperature of a to-be-charged device includes: obtaining a current temperature of the to-be-charged device that is determined in a previous calculation period. The current temperature of the to-be-charged device is determined in the previous calculation period by using the following method: after determining the charging current of the to-be-charged device, obtaining a heat generating capacity of the to-be-charged device, obtaining a heat exchanging capacity between the to-be-charged device and a coolant, obtaining a heat exchanging capacity between the to-be-charged device and an environment, and obtaining a current temperature of the to-be-charged device based on a sum of the heat generating capacity of the to-be-charged device, the heat exchanging capacity between the to-be-charged device and the coolant, and the heat exchanging capacity between the to-be-charged device and the environment.

According to the first aspect, in a possible implementation, the obtaining a heat generating capacity of the to-be-charged device includes: obtaining the heat generating capacity of the to-be-charged device based on the charging current of the to-be-charged device and a heat generation internal resistance of the to-be-charged device.

According to the first aspect, in a possible implementation, the obtaining a heat exchanging capacity between the to-be-charged device and an environment includes: obtaining the heat exchanging capacity between the to-be-charged device and the environment based on a first temperature difference between the current temperature of the to-be-charged device that is determined in the previous calculation period and a current ambient temperature in the previous calculation period.

According to the first aspect, in a possible implementation, the obtaining a heat exchanging capacity between the to-be-charged device and a coolant includes: obtaining a coolant temperature, and obtaining the heat exchanging capacity between the to-be-charged device and the coolant based on a second temperature difference between the current temperature of the to-be-charged device that is determined in the previous calculation period and the coolant temperature.

According to the first aspect, in a possible implementation, before the determining a charging current of the to-be-charged device based on a charging device current, the required current of the to-be-charged device, and a required current of a thermal management system, the method includes: obtaining the required current of the thermal management system.

According to the first aspect, in a possible implementation, the obtaining the required current of the thermal management system includes: determining the thermal management system working mode request based on a comparison between the current temperature of the to-be-charged device and a temperature threshold of the to-be-charged device; obtaining a plurality of groups of threshold parameters, where each group of threshold parameters includes a coolant temperature threshold and a coolant flow threshold, and each group of threshold parameters corresponds to a thermal management system working mode request; determining a thermal management request based on the thermal management system working mode request, where the thermal management request includes a group of threshold parameters corresponding to a thermal management system working mode in the thermal management system working mode request in the plurality of groups of threshold parameters; obtaining the coolant temperature threshold and the coolant flow threshold based on the thermal management request; obtaining heating power or cooling power of the thermal management system based on a difference between a current coolant temperature and the coolant temperature threshold; obtaining consumption power of a water pump based on a current coolant flow and the coolant flow threshold; and obtaining the required current of the thermal management system based on the heating power or the cooling power and the consumption power of the water pump. According to the charging time estimation method provided in this application, a corresponding thermal management request is obtained by using different thermal management system working modes, so as to obtain the required current of the thermal management system by obtaining power consumed by the thermal management system. The obtained required current of the thermal management system can be used to accurately estimate the charging time.

According to the first aspect, in a possible implementation, the obtaining the thermal management request includes: obtaining a plurality of groups of sample parameters, where each group of sample parameters includes a coolant sample temperature threshold and a coolant sample flow threshold, and each group of sample parameters corresponds to a thermal management system working mode request; obtaining charging times based on the plurality of groups of sample parameters; selecting a shortest charging time based on the obtained charging time; and obtaining the thermal management request based on a sample temperature threshold of the to-be-charged device, the coolant sample temperature threshold, and the coolant sample flow threshold that correspond to the shortest charging time.

According to the first aspect, in a possible implementation, the thermal management system working mode request includes a cooling request, a heating request, and a temperature equalization request.

According to the first aspect, in a possible implementation, the charging device is a charging pile.

According to the first aspect, in a possible implementation, the to-be-charged device is a battery.

According to a second aspect, an embodiment of this application provides a charging time estimation apparatus, where the apparatus includes: a data obtaining module, configured to obtain a current temperature of the to-be-charged device and a current state of charge (SOC) of the to-be-charged device; an estimation module, configured to estimate a required current of a thermal management system, a required current of the to-be-charged device, and a charging current of the to-be-charged device based on the current temperature of the to-be-charged device, the current state of charge of the to-be-charged device, and a charging device current; and a calculation module, configured to calculate a charging time based on the charging current of the to-be-charged device. According to the charging time estimation apparatus provided in this application, energy consumption of the thermal management system in a charging process is estimated, so as to resolve a problem that energy consumption of the thermal management system is not considered in a conventional charging time estimation method, so that the estimated charging time is more accurate.

According to the second aspect, in a possible implementation, when the charging device current is less than a sum of the required current of the to-be-charged device and the required current of the thermal management system, a distribution current of the thermal management system is Kx the charging device current, and the charging current of the to-be-charged device is a difference between the charging device current and the distribution current of the thermal management system, that is, $(1-K)\times$the charging device current, where K is a coefficient, and $0<K\leq 1$.

According to the second aspect, in a possible implementation, after the charging current of the to-be-charged device is determined, a heat generating capacity of the to-be-charged device is obtained, a heat exchanging capacity between the to-be-charged device and the coolant is obtained, a heat exchanging capacity between the to-be-charged device and an environment is obtained, and a current temperature of the to-be-charged device is obtained based on a sum of the heat generating capacity of the to-be-charged device, the heat exchanging capacity between the to-be-charged device and the coolant, and the heat exchanging capacity between the to-be-charged device and the environment.

According to the second aspect, in a possible implementation, obtaining the current of the thermal management system includes: determining a thermal management system working mode request based on a comparison between the current temperature of the to-be-charged device and a temperature threshold of the to-be-charged device; obtaining a plurality of groups of threshold parameters, where each group of threshold parameters includes a coolant temperature threshold and a coolant flow threshold, and each group of threshold parameters corresponds to a thermal management system working mode request; determining a thermal management request based on the thermal management system working mode request, where the thermal management request includes a group of threshold parameters corresponding to a thermal management system working mode in the thermal management system working mode request in the plurality of groups of threshold parameters; obtaining the coolant temperature threshold and the coolant flow threshold based on the thermal management request; obtaining heating power or cooling power of the thermal management system based on a difference between a current coolant temperature and the coolant temperature threshold; obtaining consumption power of a water pump based on a current coolant flow and the coolant flow threshold; and obtaining the required current of the thermal management system based on the heating power or the cooling power and the consumption power of the water pump.

According to the second aspect, in a possible implementation, the charging device is a charging pile.

According to the second aspect, in a possible implementation, the to-be-charged device is a battery.

According to a third aspect, an embodiment of this application provides a computer device, including a processor, a memory, and a computer program that is stored in the memory and that can be executed by the processor, where when executing the program, the processor implements the method in any one of the first aspect or the possible implementations of the first aspect.

According to a fourth aspect, an embodiment of this application provides a computer-readable storage medium. The computer-readable storage medium stores instructions. When the instructions are run on a computer, the computer is enabled to perform the method in any one of the first aspect or the possible implementations of the first aspect.

Embodiments of this application provide a charging time estimation method and apparatus, and a storage medium. The method can be applied to a thermal management system of an electric vehicle or an optimization model of an off-line thermal management strategy. The method not only considers that when the thermal management system changes a battery temperature in different modes, a sustainable charging current of the battery is changed, thereby affecting a charging time, but also considers that the thermal management system itself consumes a part of the power, thereby affecting the charging time. The method considers the influence of the thermal management system on the battery charging time in a future charging process, which reduces an error between an estimated charging time and an actual charging time, and makes the estimated charging time more accurate.

BRIEF DESCRIPTION OF DRAWINGS

The following briefly describes the accompanying drawings of this application. It is clear that the accompanying drawings in the following description show only some embodiments of this application.

FIG. 4(*b*) is an example flowchart of a charging time estimation method according to Embodiment 2 of this application;

DESCRIPTION OF EMBODIMENTS

Embodiments of this application provide a charging time estimation method and apparatus, and a storage medium. The following clearly describes the technical solutions in the embodiments of this application with reference to the accompanying drawings in the embodiments of this application. It is clear that the described embodiments are some but not all of the embodiments of this application. All other embodiments obtained by a person of ordinary skill in the art based on the embodiments of this application without creative efforts shall fall within the protection scope of this application.

To make a person skilled in the art better understand the technical solutions provided in the embodiments of this application, the following first describes an application scenario of a charging time estimation method, an apparatus, and a storage medium that are provided in the embodiments of this application.

Figure 1:
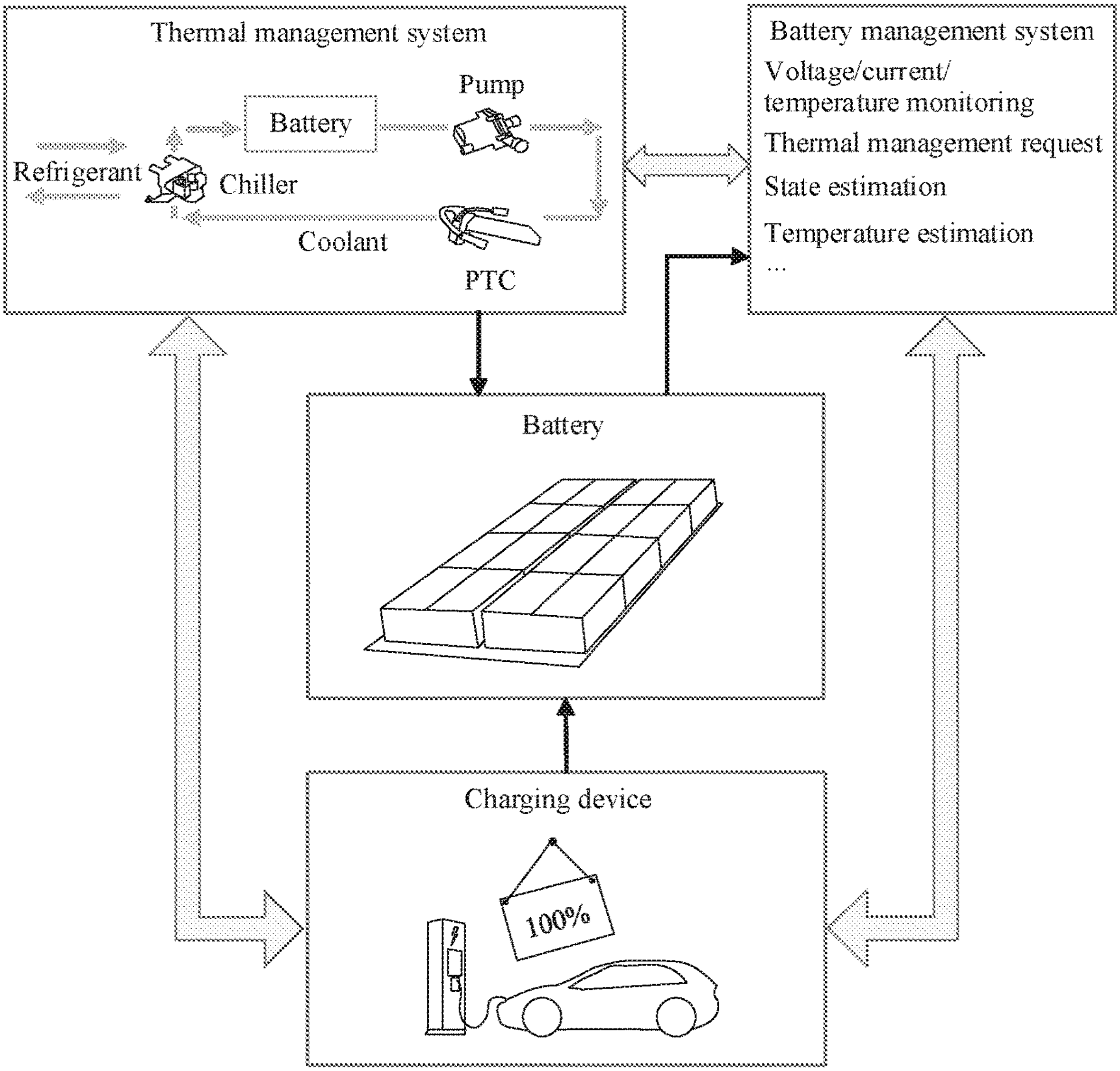
FIG. 1 is an example schematic diagram of an electric vehicle charging system according to an embodiment of this application.

FIG. 1 is a schematic diagram of an electric vehicle charging system according to an embodiment of this application. The electric vehicle charging system shown in FIG. 1 is an application scenario of an electric vehicle charging time estimation method. The electric vehicle charging system includes a charging device 104, a battery 103, a battery management system (BMS) 102, and a thermal management system (TMS) 101. It should be noted that the charging device 104 in this application may be a charger, a charging pile, an on-board charger, or an electric vehicle. The to-be-charged device may include a single electrochemical cell unit, or may include a plurality of electrochemical cell units, or may include a battery pack, or the like. This is not specifically limited in this application.

The charging pile inputs a charging current to the battery 103 and the thermal management system 101 according to a required current instruction output by the battery management system 102 and in combination with a current of the charging pile. The battery management system 102 determines a current state of the battery 103 based on a detected voltage, current, and temperature of the battery 103, and requests corresponding thermal management. The thermal management system 101 receives a thermal management request output by the battery management system 102, and heats or cools the battery 103, or equalizes the battery temperature. The thermal management system 101 affects the battery temperature by adjusting a coolant temperature, so as to change the sustainable charging current of the battery 103. In addition, an operation of each part of the thermal management system 101 also consumes some current. Therefore, the thermal management system 101 plays a non-negligible role in estimating a charging time.

Figure 2:
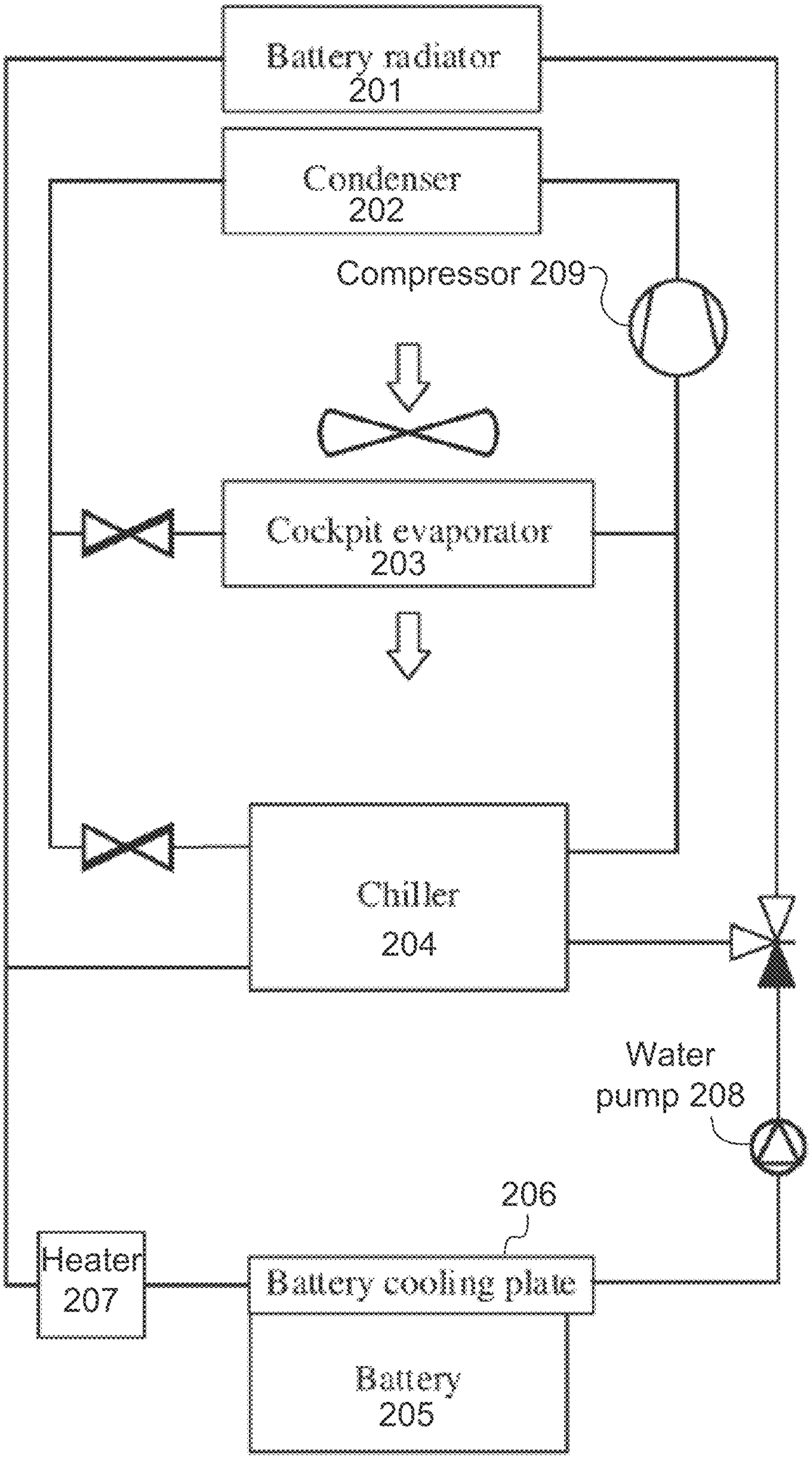
FIG. 2 is an example schematic diagram of a structure of an active liquid cooling battery thermal management system according to an embodiment of this application.

FIG. 2 is a schematic diagram of a structure of an active liquid cooling battery thermal management system according to an embodiment of this application.

As shown in FIG. 2, a battery loop of a thermal management system of an electric vehicle includes a heater 207 (Positive Temperature Coefficient, PTC) configured to heat a battery 205 in a low-temperature environment, a water pump 208, a compressor 209, a condenser 202, a battery radiator 201, a cockpit evaporator 203, and a chiller 204. There are two ways to cool the battery: (1) When an ambient temperature is relatively low, for example, between 1° and 15° C., a battery system temperature is reduced to an operating range by passive cooling through a battery system loop, that is, the battery radiator 201 is directly used to dissipate heat to meet a cooling requirement of the battery 205, thereby reducing energy consumption of the thermal management system. (2) In a case of high ambient temperature or high battery heat generation, for example, in a case of fast charging, active cooling (also called compression cooling) is adopted through a refrigerant loop, the compressor 209 is started, the condenser 202, a throttle valve, and the chiller 204 are used to lower a battery temperature. Heat exchange is performed between a refrigerant and the coolant to cool the coolant, and the coolant performs heat exchange with the battery 205 by passing through a battery cooling plate 206 under driving of the water pump 208, so as to achieve an objective of rapidly cooling the battery. After heat exchange between the refrigerant and the coolant, the refrigerant passes through the compressor to become high temperature and high pressure gas, and the high temperature and high pressure gas is cooled by passing through the condenser 202. The refrigerant passes through the throttle valve, so that the coolant becomes low temperature and low pressure liquid. Then, the refrigerant enters a next cycle through the chiller 204, and then performs heat exchange with the coolant. When the battery temperature is too low, the heater 207 heats the coolant flowing into the battery cooling plate and exchanges heat with the battery 205 to increase the battery temperature. Therefore, in a charging process, to maintain the battery temperature in an optimal range and ensure that a sustainable charging current can reach 2 C to 3 C, components in the thermal management system of the electric vehicle, such as the compressor 209 (cooling) or the heater 207 (heating), and the water pump 208, run as required. The operation of the thermal management system components consumes a portion of the current output from the charging pile. Therefore, the thermal management system state is a non-negligible part of estimation of a charging time during battery charging, especially in a high/low temperature environment.

In this application, the thermal management system working state in the charging process is estimated by combining a battery temperature estimation model, a thermal management system model, and a BMS thermal management strategy, so as to more accurately estimate the charging time.

Figure 3:
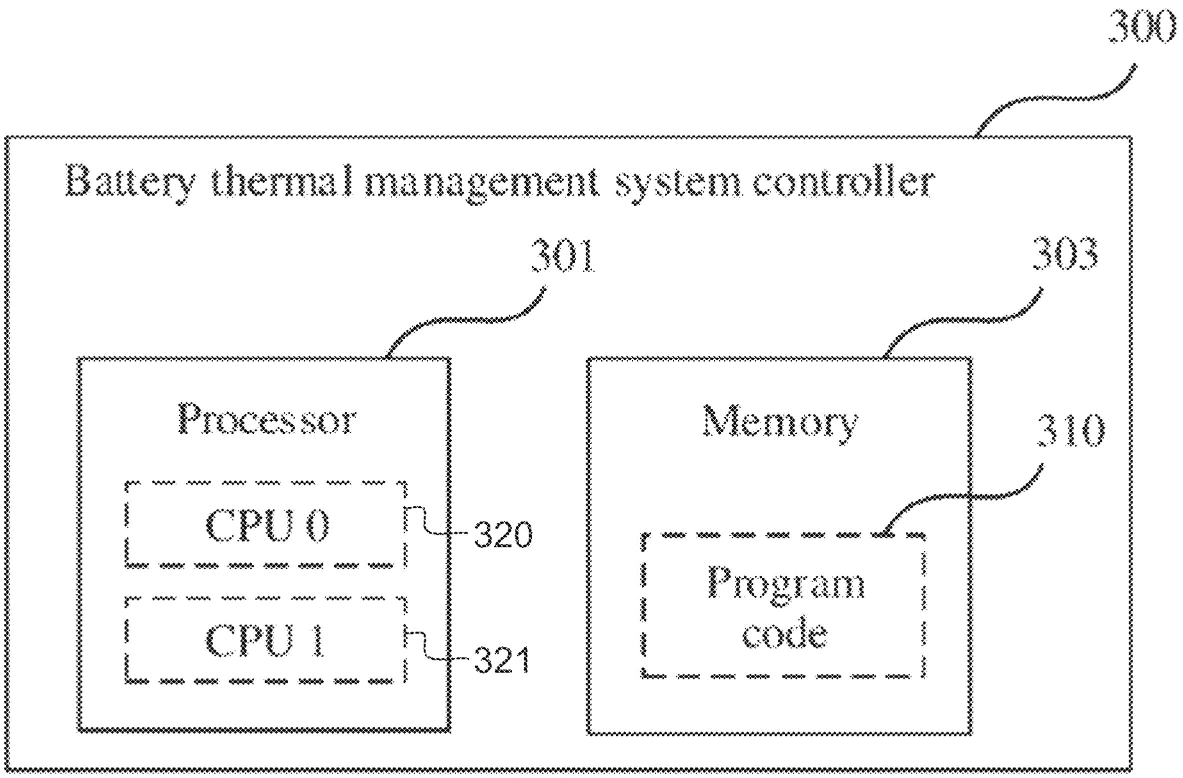
FIG. 3 is an example schematic diagram of a structure of an in-vehicle battery thermal management system controller according to an embodiment of this application.

FIG. 3 is a schematic diagram of a structure of an in-vehicle battery thermal management system controller according to an embodiment of this application. A battery thermal management system controller 300 includes a processor 301 and a memory 303 combined with the processor 301. The memory 303 stores program code 310 of a charging time estimation method provided in this embodiment of this application. The processor 301 is configured to execute the program code 310 stored in the memory. The battery thermal management system controller 300 may implement, by using the processor 301 and the program code 310 in the memory 303, the charging time estimation method provided in the embodiments of this application. It may be understood that the battery thermal management system may be located in a battery pack, and the battery pack is a part of a vehicle powertrain. The battery pack includes a battery body, a battery housing, a battery management system, and peripheral components such as a relay and a sensor. Optionally, a charging module in the battery thermal management system controller 300 includes the processor 301 and the memory 303, to store program code 310 of a charging time estimation method provided in this embodiment of this application. In another embodiment, the vehicle controller includes a processor 301 and a memory 303. The memory 303 may alternatively store program code 310 of a charging time estimation method provided in this embodiment of this application. The processor 301 is configured to execute the program code 310 stored in the memory.

The processor 301 may be a general-purpose central processing unit (CPU), a microprocessor, an application-specific integrated circuit (ASIC), or a field programmable gate array (FPGA), or may be one or more integrated circuits configured to control program execution in the solutions of this application. The processor 301 may include multiple CPUs ("CPU 0" 320 and "CPU 1" 321).

The memory 303 may be a read-only memory (ROM) or another type of static storage device that can store static information and instructions, or may be a random access memory (RAM) or another type of dynamic storage device that can store information and instructions, or may be an electrically erasable programmable read-only memory (EEPROM), a compact disc read-only memory (CD-ROM) or another optical disk storage, an optical disc storage (including a compact disc, a laser disc, an optical disc, a digital versatile disc, a Blu-ray disc, and the like), or a disk storage medium or another magnetic storage device, or any other medium capable of carrying or storing desired program code 310 in a form of instructions or a data structure and capable of being accessed by a computer. This application not limited thereto.

The following describes a charging time estimation method provided in Embodiment 1 of this application.

Figure 4A:
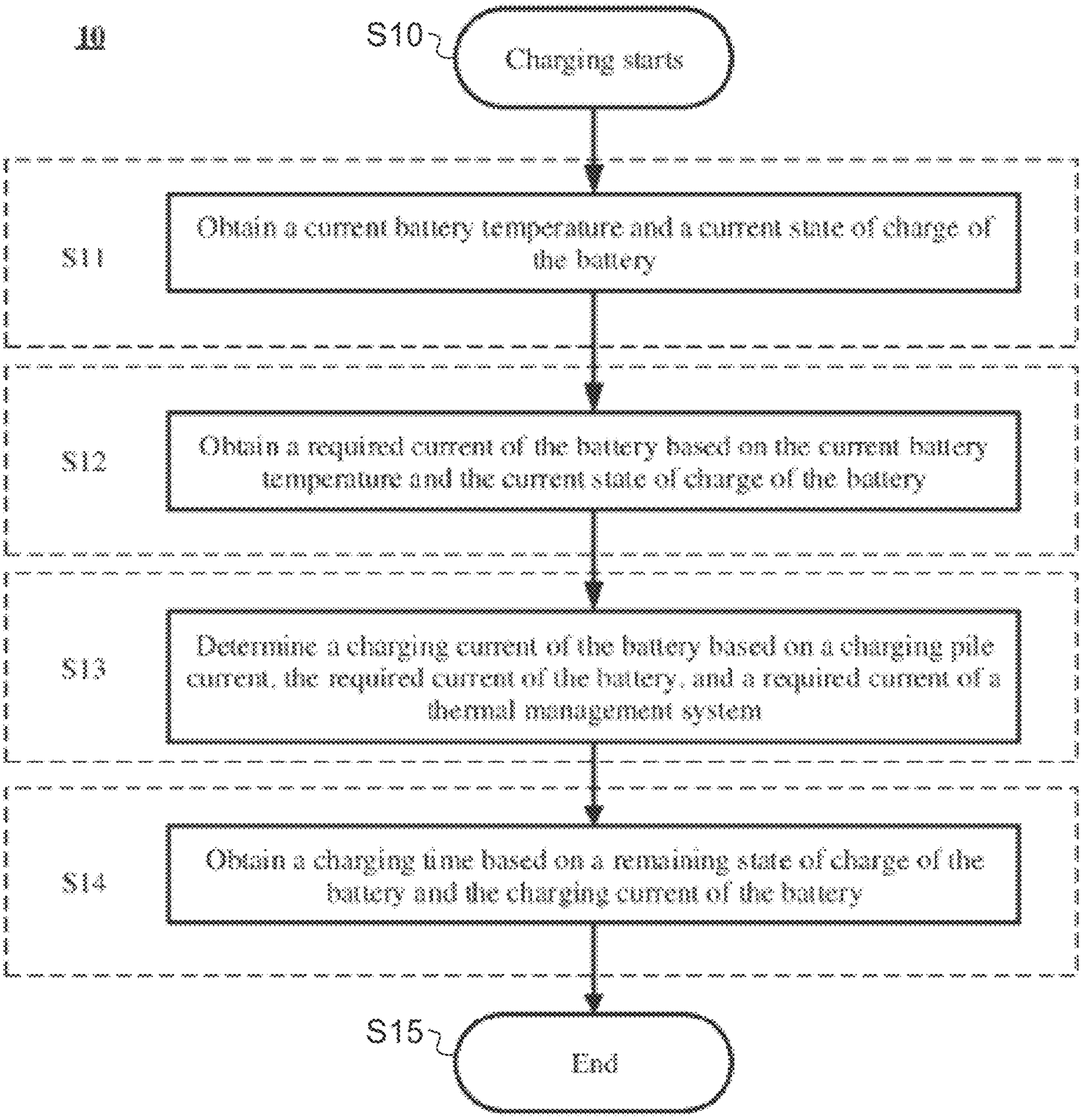
FIG. 4(*a*) is an example flowchart of a charging time estimation method according to Embodiment 1 of this application.
Figure 4B:
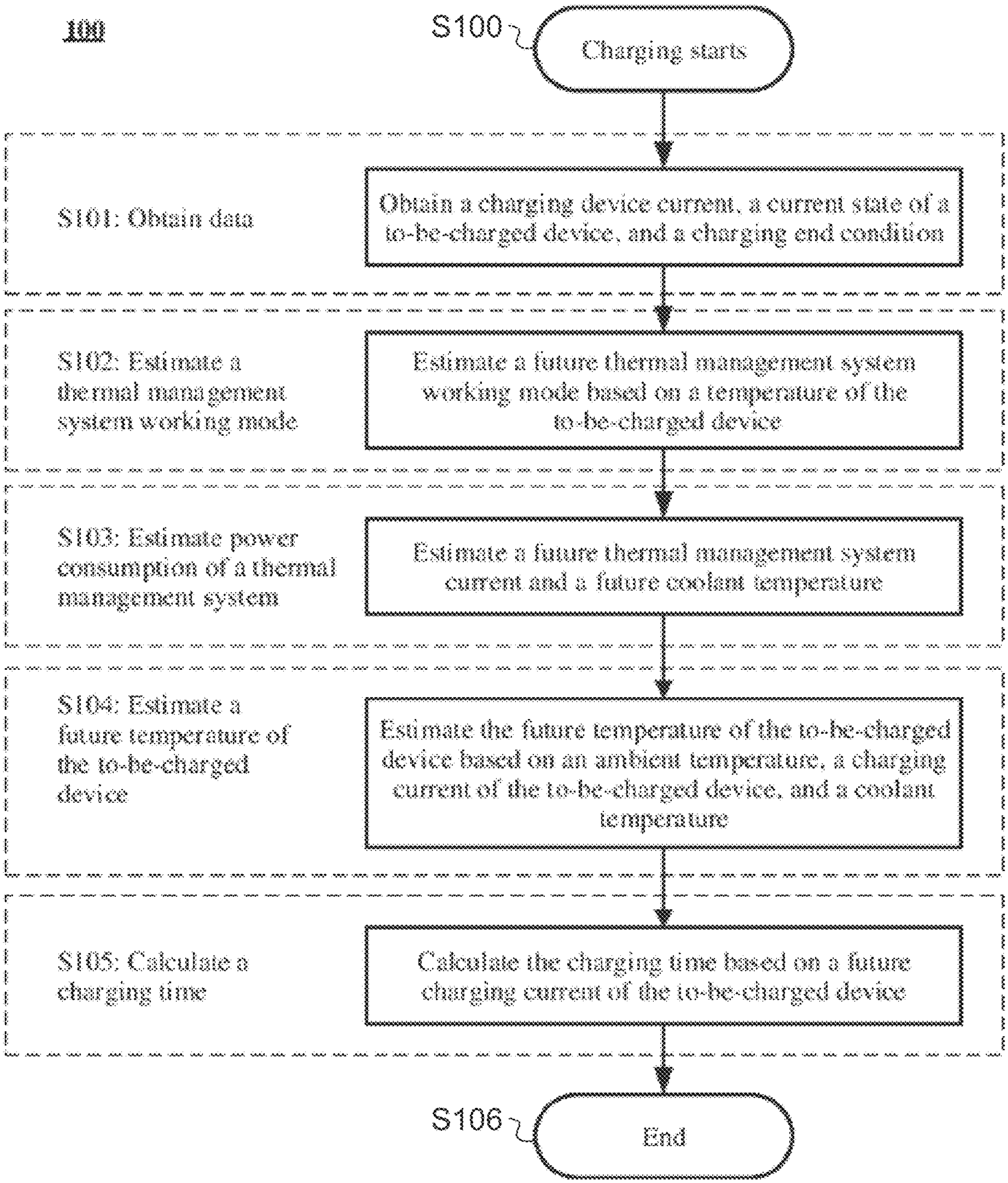

FIG. 4(*a*) is a flowchart of a charging time estimation method according to Embodiment 1 of this application. The method 10 may be performed by user equipment such as an in-vehicle battery management system controller and a vehicle controller. In one calculation cycle, the method 10 includes the following steps.

Step S10: Changing starts.

Step S11: Obtain a current battery temperature and a current state of charge of the battery.

This step is used for obtaining data, for example, before charging starts, the current battery temperature and the current state of charge of the battery are obtained. During a charging process, the current battery temperature and the current state of charge of the battery are updated in real time based on estimated parameters. Optionally, the current battery temperature may be a specific battery temperature on a vehicle, or may be assigned based on a historical empirical value.

Step S12: Obtain a required current of the battery based on the current battery temperature and the current state of charge of the battery.

Based on the current battery temperature and the current state of charge of the battery that are obtained in step S11, the required current of the battery may be obtained by looking up a table (e.g., via a look-up table).

Step S13: Determine a charging current of the battery based on a current of a charging pile, the required current of the battery, and a required current of a thermal management system.

It should be noted that the charging pile current may be less than the required current of the battery in the charging process. Therefore, the charging current Ibat_charge of the battery and a distribution current Ithermal_charge of the thermal management system need to be distributed based on the current Imax of the charging pile, the required current of the battery Ibat_req, and the required current Ithermal_req of the thermal management system.

When Imax>=Ibat_req+Ithermal_req, the charging current that can be provided to the battery is the required current of the battery Ibat_charge=Ibat_req. The distribution current that can be provided to the thermal management system is Ithermal_req.

When Imax<Ibat_req+Ithermal_req, the distribution current that can be provided to the thermal management system is K×Imax, where $0<K\leq 1$. A value of K depends on a current charging strategy of the battery, for example, whether the charging priority is heating priority or charging priority. The charging current of the battery is Imax×(1−K).

Step S14: Obtain a charging time based on a remaining state of charge of the battery and the charging current of the battery.

It should be noted that the remaining state of charge of the battery is a difference between a target state of charge in a charging end condition and a current state of charge of the battery. The most direct factors affecting the charging time are the remaining state of charge and the charging current Ibat_charge of the battery. Based on the remaining state of charge, the charging current Ibat of the battery, and a rated capacity C of the battery, a future charging time can be calculated according to an Ah integral method.

Optionally, an estimated charging time signal is output to a human machine interface (HMI) to prompt a user.

Step S15: End.

The following describes a charging time estimation method provided in Embodiment 2 of this application.

FIG. 4(*b*) is a flowchart of a charging time estimation method 100 according to Embodiment 2 of this application. The method 100 may be performed by user equipment such as an in-vehicle battery management system controller and a vehicle controller. The method 100 includes the following steps.

Step S100: Charging starts.

Step S101: Obtain a current of a charging pile, a current state of a battery, and a charging end condition.

This step is used for obtaining data. For example, before charging starts, the current of the charging pile, an initial state of the battery, such as an initial SOC and an initial temperature, and the charging end condition, such as a target state of charge (SOC) of the battery and a state of energy (SOE) at the end of charging are obtained. During a charging process, the current state (such as a current SOC and a current temperature) of the battery is updated in real time based on estimated parameters. The SOC is a ratio of a current state of charge of the battery to a total capacity of charge.

Step S102: Estimate a thermal management system working mode. Estimate a thermal management system working mode based on a battery temperature.

It should be noted that, based on an ambient temperature in the current charging process, a current battery temperature, and the current SOC, a BMS may estimate the thermal management system working mode in a future charging process, and send a thermal management request to a TMS based on the thermal management system working mode. The thermal management request includes a working mode request (e.g., a cooling request, a heating request, a temperature equalization request, or the like). A thermal management strategy includes a battery temperature threshold, a coolant temperature threshold, and a coolant flow threshold.

Step S103: Estimate power consumption of the thermal management system. Estimate currents distributed by the thermal management system and the battery, and a coolant temperature.

It should be noted that the thermal management system model estimates the working state of each component based on the thermal management request sent by the BMS in the future charging process.

For example, based on the requested coolant temperature threshold and coolant flow threshold, the thermal management system model calculates power of a PTC or heat pump and a rotational speed requirement of a water pump in the case of the heating request.

Based on the requested coolant temperature threshold and coolant flow threshold, the thermal management system calculates power of a compressor or a radiator and the rotational speed requirement of the water pump in the case of the cooling request.

The thermal management system calculates the rotational speed requirement of the water pump based on the requested coolant temperature threshold and coolant flow threshold in the case of the temperature equalization request. Based on the working state of each component, the required current of the thermal management system in the future charging process is obtained. The current or power distributed by the thermal management system and the battery is obtained by using the current of the charging pile, the required current of the thermal management system, and the required current of the battery. In addition, the thermal management system model needs to estimate a coolant temperature change in the future charging process, and send the change to S104 to further estimate a battery temperature.

Step S104: Estimate a battery temperature. Estimate a future battery temperature based on an ambient temperature, a charging current of the battery, and the coolant temperature.

It should be noted that the battery temperature change in the future charging process is estimated based on the ambient temperature, the charging current of the battery, and the coolant temperature in the future charging process. The charging current of the battery in the future charging process is obtained in step S103.

Step S105: Calculate a charging time. Calculate a charging time based on a future charging current of the battery.

It should be noted that the required current of the thermal management system in the future charging process is obtained based on the working state of each component in S103. The charging current of the battery is obtained by using the current of the charging pile, the required current of the thermal management system, and the required current of the battery. The charging time is calculated based on the charging current of the battery and the future charging state of the battery, that is, the remaining SOC of the battery. Optionally, an estimated charging time signal is output to a human machine interface (HMI) to prompt a user.

It may be understood that the charging pile may include a charging pile, a charger, a charger, a vehicle, a mobile terminal capable of reverse charging, and the like. The battery may include a vehicle, a battery, another mobile terminal, and the like. Therefore, the method 100 may be executed by user equipment such as a processor or a BMS of an electric vehicle.

Step S106: End.

The following describes an electric vehicle charging time estimation method provided in Embodiment 3 of this application.

Figure 5:
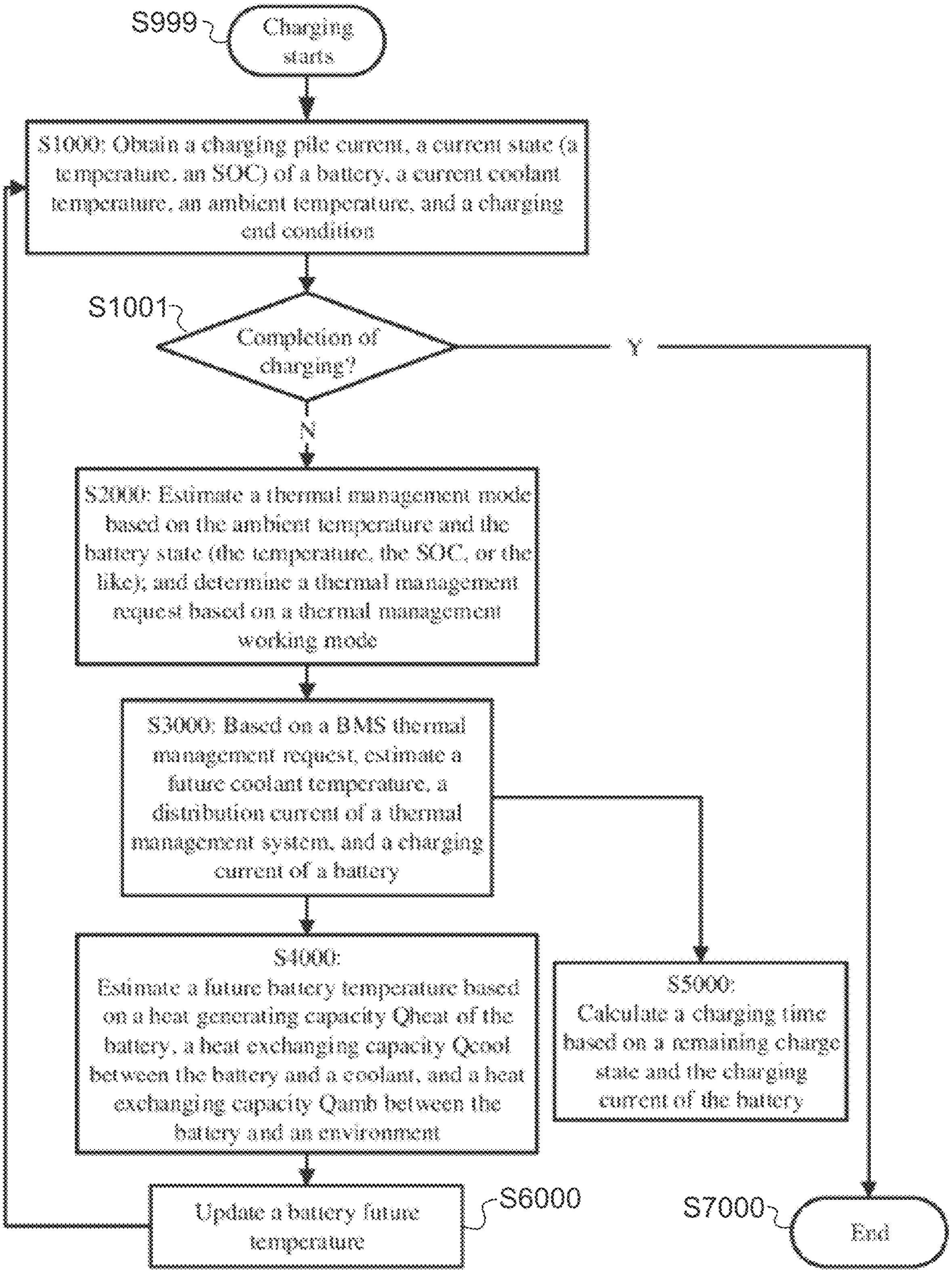
FIG. 5 is an example flowchart of an electric vehicle charging time estimation method according to Embodiment 3 of this application.

FIG. 5 is a flowchart of an electric vehicle charging time estimation method according to Embodiment 3 of this application. Refer to FIG. 5. The method includes the following steps.

Step S999: Charging starts.

Step S1000: Obtain a charging pile current, a current state of a battery, a current coolant temperature, an ambient temperature, and a charging end condition.

It should be noted that, to accurately estimate a charging time, before charging starts, an initial state of the battery, such as a battery temperature, a state of charge (SOC) of the battery, a state of health (SOH) of the battery, and an initial coolant temperature, needs to be obtained. During a charging process, the current state of the battery, such as the current SOC and current battery temperature, is updated in real time based on estimated parameters. The BMS queries the table to obtain a required current of the battery based on the current temperature and SOC of the battery.

In addition, an ambient temperature curve in the charging process and a charging end condition of the battery, such as a target SOC, need to be obtained.

S1001: Completion of charging? If not, go to Step S2000. If yes, go to Step S7000 (End).

Step S2000: Estimate a thermal management system working mode request based on the ambient temperature and battery state, and determine a thermal management request based on the thermal management system working mode request.

The BMS determines a thermal management system working mode based on the ambient temperature in the current charging process, the current battery temperature, and the current SOC, determines the thermal management request based on the thermal management system working mode request, and sends the thermal management request to the TMS. The thermal management request includes a coolant temperature threshold and a coolant flow threshold. The coolant temperature threshold and the coolant flow threshold may be obtained in a manner such as experiment, simulation optimization, a BMS thermal management strategy optimization model, a historical empirical value, a table lookup, or the like.

Step S3000: Estimate a distribution current of the thermal management system, a charging current of the battery, and a coolant temperature based on the BMS thermal management request.

Based on the estimated thermal management system working mode request in a future charging process and the corresponding thermal management request in step S2000, the distribution current of the thermal management system, the required current of the thermal management system, the charging current of the battery, and the coolant temperature in the future charging process are estimated.

Step S4000: Estimate a future battery temperature.

During the charging process, the charging current of the battery, the coolant temperature, and the ambient temperature affect the battery temperature. In order to more accurately estimate the battery temperature in the future charging process, battery temperature estimation models may be established, including a battery heat generation model, a battery-ambient heat exchange model, and a battery-coolant heat exchange model.

Based on a charging current Ibat_charge of the battery that is obtained in step S3004 in a method for estimating the distribution current of the thermal management system, the charging current of the battery, the coolant temperature provided in Embodiment 5 below, a heat generating capacity Qheat of the battery at each moment in the future is obtained by using the battery heat generation model. Qheat=Ibat_charge2×R, where R is a heat generation internal resistance of a cell, and is related to an SOC, a temperature, a service life, and another battery parameter of the battery. The battery heat generation model may be obtained based on an HPPC experimental result, battery parameters (mass, density, specific heat capacity, thermal conductivity).

Based on a coolant temperature Tcoolant, a coolant flow rate, and a current battery temperature Tbat that are obtained in step S3005 in the method for estimating the distribution current of the thermal management system, the charging current of the battery, and the coolant temperature provided in Embodiment 5 below, a heat exchanging capacity Qcool between the battery and the coolant is obtained through calculation by using the battery-coolant heat exchange model. The heat exchanging capacity Qcool between the battery and the coolant is equal to battery-coolant heat exchange coefficient×(battery temperature−coolant temperature). Based on the current of the charging pile, the ambient temperature, the coolant temperature, and the coolant flow rate, the battery-coolant heat exchanged coefficient is obtained through calculation by using the battery-coolant heat exchange model.

Based on the current ambient temperature and the current battery temperature Tbat, a heat exchanging capacity Qamb between the battery and an environment is calculated by using a battery-ambient heat dissipation model. Qamb=battery−ambient heat dissipation coefficient×(Tbat−Tamb). The battery-ambient heat dissipation coefficient is calculated based on a thermal insulation test result by using the battery-ambient heat dissipation model.

The future battery temperature can be calculated based on the Qheat, Qcool, and Qamb obtained above. A sum of Qheat, Qcool, and Qamb is C×m×ΔT, where C is a specific heat capacity of the battery, m is the mass of the battery, and ΔT is a difference between the current battery temperature and the future battery temperature. The obtained future battery temperature is used to update a battery state in a next calculation period (Step S6000), and each parameter in the next calculation period is further estimated and calculated. Similarly, the current battery temperature may obtain, after a charging current of a to-be-charged device is determined in a previous calculation period, a heat generating capacity of the to-be-charged device, a heat exchanging capacity between the to-be-charged device and the coolant, and a heat exchanging capacity between the to-be-charged device and the environment, and obtain a current temperature of the to-be-charged device based on a sum of the heat generating capacity of the to-be-charged device, the heat exchanging capacity between the to-be-charged device and the coolant, and the heat exchanging capacity between the to-be-charged device and the environment.

Step S5000: Calculate a charging time in the future charging process.

It should be noted that the most direct factors affecting the charging time are a remaining state of charge and the charging current Ibat_charge of the battery. Based on the remaining state of charge, the charging current Ibat, and a rated capacity CN of the battery, the future charging time can be calculated according to an Ah integral method. According to step S3003, the charging current of the battery is obtained based on the required current of the battery, the required current of the thermal management system, and the current of the charging pile. The remaining state of charge is a difference between the target SOC in the charging end condition and a current SOC of the battery.

In a process of estimating the charging time, steps S1000 to S6000 are cyclically performed until the charging is completed (Step S1001). At each moment, a working state of the thermal management system in the future charging process may be estimated, and a parameter (a current, a temperature, or the like) estimated at each moment in the future may be obtained, and the future charging time may be calculated. Optionally, the estimated parameter obtained at each moment is compared with an actual parameter (a current, a temperature, or the like) at each moment, and a parameter error in the estimation process is corrected, so that the charging time in the future charging process can be estimated more accurately.

In Embodiment 3 of this application, a thermal management system behavior in the future charging process is estimated with reference to the battery temperature estimation model, the BMS thermal management strategy, and the thermal management system model. In Embodiment 3 of this application, the working state of the thermal management system in the future charging process is estimated, and the distribution current of the thermal management system and the coolant temperature in the future charging process are calculated, so as to resolve a problem that impact of the thermal management system on the charging time is not considered in a conventional charging time estimation method.

Figure 6:
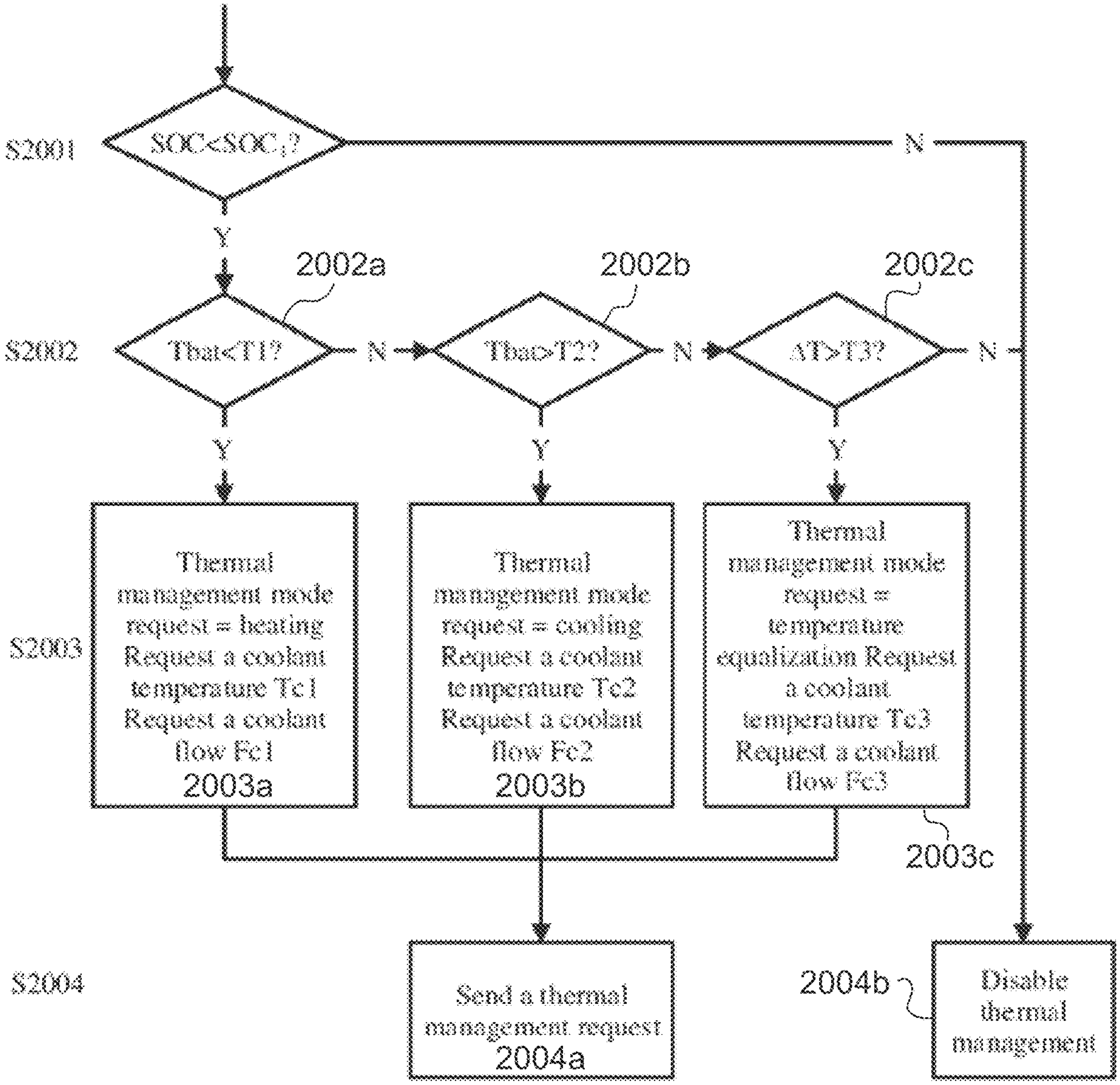
FIG. 6 is an example flowchart of steps of estimating a thermal management system working mode according to Embodiment 4 of this application.

Based on the foregoing embodiments, the S2000 steps in Embodiment 3 are described in this embodiment. FIG. 6 is a flowchart of steps of estimating a thermal management system working mode according to Embodiment 4 of this application, and is shown as follows.

Step S2001: Compare a current SOC of a battery with a preset battery threshold SOC 1.

A BMS thermal management module obtains the current SOC of the battery based on a current battery temperature Tbat in a charging process and a current required current of the battery. The obtained current SOC of the battery is compared with the preset battery threshold SOC 1.

The SOC 1 may be obtained through experiments, simulation optimization, a BMS thermal management strategy, a historical empirical value, and table query.

If the current SOC is greater than the SOC 1, a maximum chargeable current is mainly limited by the SOC instead of the battery temperature due to a characteristic of a cell itself. Therefore, when the SOC is greater than the SOC 1, the thermal management system is disabled to keep the battery temperature within an optimal range (for example, 25-35° C.) to avoid additional power consumption. Therefore, in step S2001, an SOC state in a future charging process is first determined, and if the SOC is greater than the SOC 1, the thermal management system is disabled. If the SOC is less than the SOC 1, the thermal management system is started.

Step S2002: Determine the thermal management system working mode based on the battery temperature.

The battery temperature in the future charging process is compared with the battery temperature thresholds T1 (2002*a*), T2 (2002*b*), and T3 (2002*c*), and a BMS battery management system determines whether the thermal management system working mode is cooling (2003*b*), heating (2003*a*), or temperature equalization (2003*c*), and sends a determined working mode request to the thermal management system (2004*a*). The T1, T2, and T3 may be obtained through experiments, simulation optimization, a BMS thermal management strategy optimization model, historical empirical values, table query, and the like.

Step S2003: Determine a thermal management request based on the thermal management system working mode request.

A plurality of groups of threshold parameters are obtained, where each group of threshold parameters includes a coolant temperature threshold and a coolant flow threshold, each group of threshold parameters corresponds to a thermal management system working mode request. The thermal management request is determined based on the thermal management system working mode request, where the thermal management request includes a group of threshold parameters corresponding to a thermal management system working mode in the thermal management system working mode request in the plurality of groups of threshold parameters.

When the battery is supercooled, that is, the battery temperature is less than a preset battery temperature threshold Tbat<T1, the BMS requests a working mode request of battery heating to a vehicle thermal management controller in the thermal management system, that is, a relatively high-temperature coolant is introduced into a battery cooling plate, and the coolant exchanges heat with the battery to heat up the battery. In addition, when Tbat<T1, the BMS may further request the vehicle thermal management controller in the thermal management system that the coolant temperature threshold is Tc1 and the flow threshold is Fc1.

When the battery is overheated, that is, the battery temperature is greater than the preset battery temperature Tbat>T2, the BMS requests the vehicle thermal management controller for a working mode of battery cooling, that is, a coolant with a relatively low temperature is introduced into the battery cooling plate, and the coolant exchanges heat with the battery to reduce the battery temperature. Therefore, when Tbat>T2, the BMS also requests the vehicle thermal management controller in the thermal management system that the coolant temperature is Tc2 and the flow rate is Fc2.

When a temperature difference of the battery itself is too large, that is, the temperature difference of each part of the battery is greater than the preset temperature difference ΔT>T3, a working mode request of battery temperature equalization is proposed to the vehicle thermal management controller, that is, the coolant flow rate in the battery cooling plate is increased or a flow direction of the coolant is changed, so as to achieve a purpose of equalizing the battery temperature. ΔT is a temperature difference of the battery, that is, a difference between a maximum value and a minimum value of temperatures of different parts of the battery. Therefore, when ΔT>T3, the BMS may further request the vehicle thermal management controller in the thermal management system that the coolant temperature is Tc3 and the flow rate is Fc3.

When energy consumption is not considered, the battery is cooled, and an ideal temperature reached by heating is between 25 and 35° C., and a temperature difference of the battery is less than 5° C.

Tc1 to Tc3 and Fc1 to Fc3 are preset thresholds, and may be obtained through experiments, simulation optimization, a BMS thermal management strategy optimization model, historical empirical values, table query, or the like.

Step S2004: Send the thermal management request to a thermal management system module (2004*a*) or disable the thermal management system (2004*b*).

In step S2001, an SOC state in a future charging process is first determined, and if the SOC is greater than the SOC 1, the thermal management system is disabled. If the SOC is less than the SOC 1, the thermal management system is started. The coolant temperature and the flow rate requested based on the different thermal management modes in step S2003 are sent to the thermal management system module.

Figure 7A:
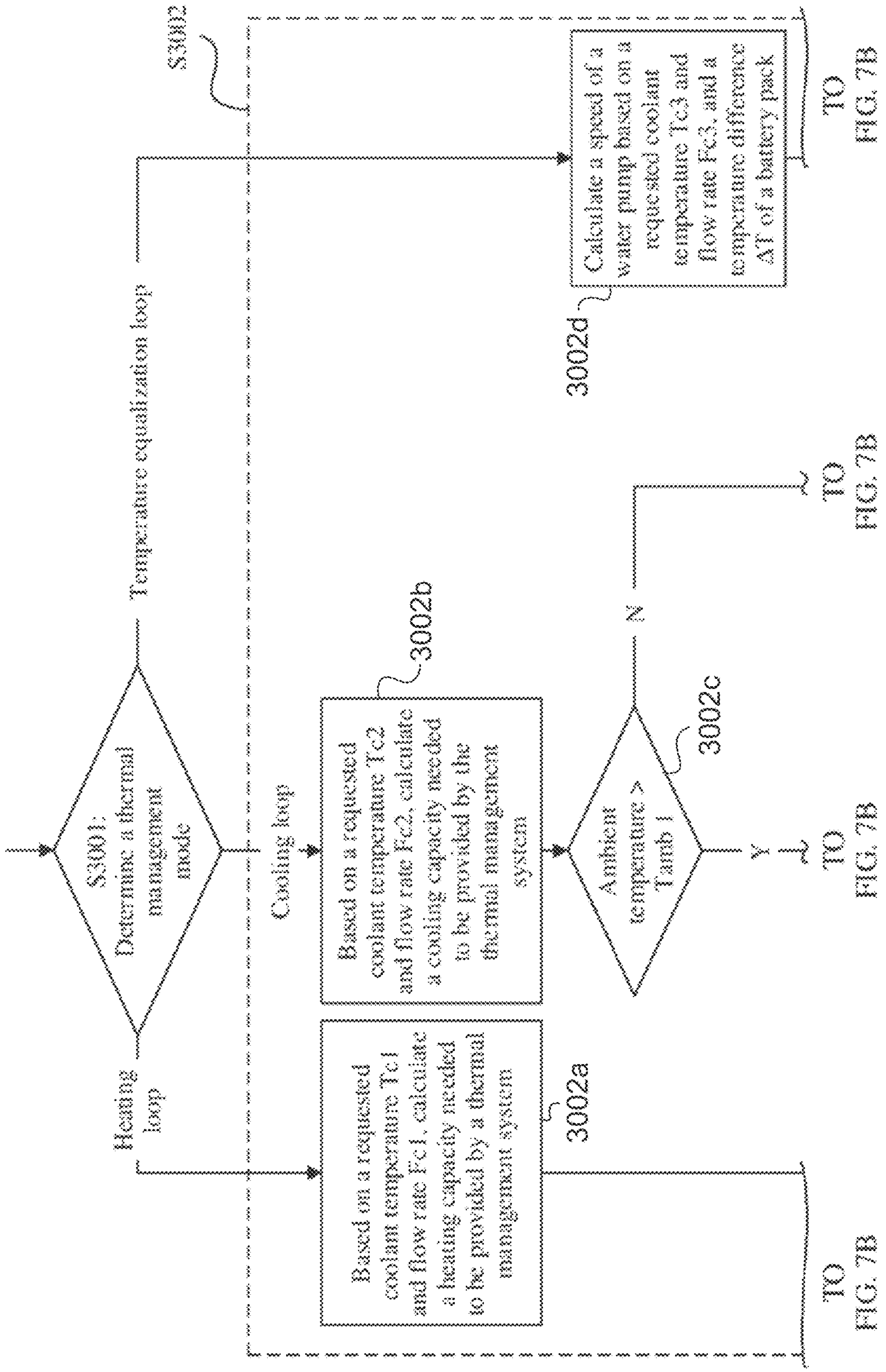
FIG. 7A and FIG. 7B are example flowcharts of steps of estimating a distribution current of a thermal management system, a charging current of a battery, and a coolant temperature according to Embodiment 5 of this application.
Figure 7B:
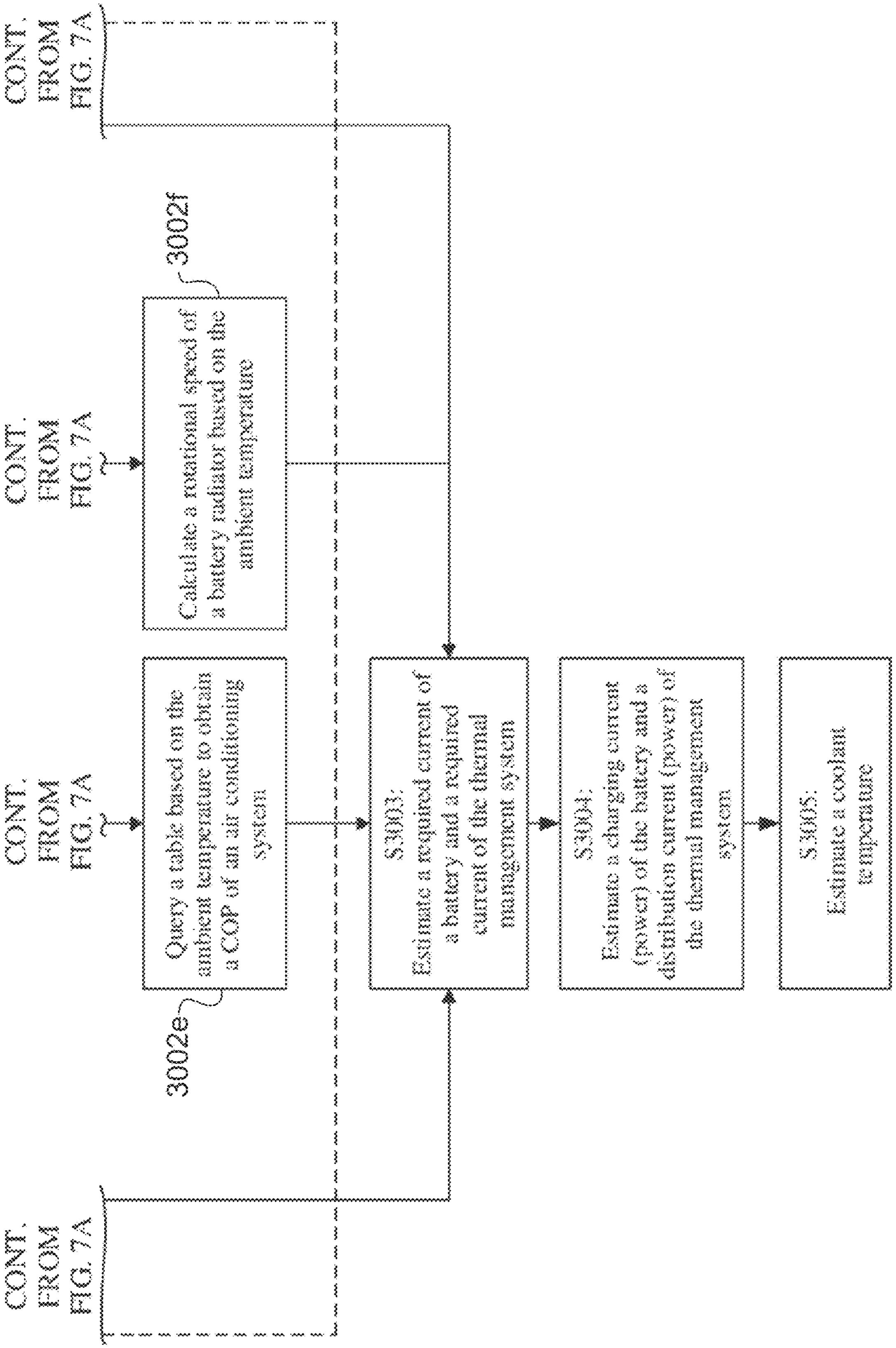

Based on the foregoing embodiments, the S3000 steps in Embodiment 3 are described in this embodiment. FIG. 7A and FIG. 7B are a flowchart of steps of a method for estimating a distribution current of a thermal management system, a charging current of the battery, and a coolant temperature according to Embodiment 5 of this application. The method includes the following steps.

Step S3001: Determine a thermal management mode.

A thermal management request is determined based on the thermal management system working mode request sent by the BMS in step S2003. After receiving the BMS request, a TMS model simulated in the BMS estimates a thermal management system working mode request in a future charging process, that is, a heating request, a cooling request, and a temperature equalization request. The coolant temperature threshold is obtained based on the thermal management request. Heating power or cooling power of a thermal management system is obtained based on a difference between a current coolant temperature and the coolant temperature threshold. Consumption power of a water pump is obtained based on a current coolant flow and a coolant flow threshold. A required current of the thermal management system is obtained based on the heating power or the cooling power and the consumption power of the water pump. If the battery needs heating, a heating loop power calculation module in the TMS model simulated in the BMS is triggered. If the battery needs cooling, a cooling loop power calculation module in the TMS model simulated in the BMS is triggered. If the battery needs temperature equalization, a battery temperature equalization loop power calculation module in the TMS model simulated in the BMS is triggered.

Step S3002: Estimate a heating capacity and power of a heating loop, a cooling loop, and a temperature equalization loop.

a. Heating Loop

3002*a*: Based on the thermal management request of the coolant temperature threshold Tc1 sent by the BMS to a vehicle thermal management controller in the thermal management system in step S2003 and the current coolant temperature, and based on a temperature difference between the two and a coolant flow rate Fc1, the heating capacity of the heating loop and consumption power of a PTC (consumption power of PTC=heating capacity/efficiency) or consumption power of a heat pump (consumption power of heat pump=heating capacity/energy efficiency ratio of heat pump, COP, coefficient of performance, where the COP of the heat pump is greater than 1), and the heating power of the pump can be calculated. The heating power of the water pump is proportional to the coolant flow rate. A control algorithm of the PTC or the heat pump may be a PID control algorithm, a fuzzy control algorithm, or the like.

b. Cooling Loop

3002*b*: Based on the request of the coolant temperature threshold Tc2 and the flow rate Fc2 sent by the BMS to the vehicle thermal management controller in the thermal management system in step S2003 and the current coolant temperature, the cooling capacity and the power to be provided by the thermal management system are calculated. The cooling capacity can be calculated by C×m×(current coolant temperature−coolant temperature threshold Tc2). A current ambient temperature is compared with a preset ambient temperature threshold Tamb1, so that it is determined that the triggered cooling loop is active cooling or passive cooling.

3002*c*/3002*e*/3002*f*: When the ambient temperature is greater than the preset ambient temperature threshold Tamb1, the triggered cooling loop is active cooling. In this case, cooling power of a cooling loop component (such as a compressor and the water pump) is calculated based on a COP of a compressor cooling operation and the coolant flow rate. It may be understood that the consumption power of the compressor is a value obtained by the cooling capacity divided by the COP of the compressor. The cooling power of the water pump is proportional to the coolant flow rate.

When the ambient temperature is less than or equal to the ambient temperature threshold Tamb1 preset by an analog thermal management controller, the triggered cooling loop is passive cooling. In this case, rotational speeds of a battery radiator and the water pump are calculated based on the ambient temperature, so as to calculate the cooling power of the cooling component (such as the battery radiator and the water pump). It may be understood that the cooling power of the battery radiator is directly proportional to the rotation speed of the battery radiator. The cooling power of the water pump is proportional to the coolant flow rate. Optionally, the battery radiator may be a cooling fan.

c. Temperature Equalization Loop

3002*d*: Based on the request of the coolant temperature threshold Tc3 and the flow threshold Fc3 sent by the BMS to the vehicle thermal management controller in the thermal management system in step S2003, and the current coolant temperature, and based on an actual temperature difference of the battery, the coolant flow rate to be provided by the thermal management system is calculated, so as to calculate the rotation speed of the water pump. Then the consumption power of the pump is obtained. The consumption power of the water pump is proportional to the coolant flow rate.

Step S3003: Estimate a required current of the battery and the required current of the thermal management system.

Based on the current battery temperature Tbat, an SOC of the battery, and f(SOC, Tbat), the required current of the battery can be obtained by querying the table.

An energy consumption calculation model of the thermal management system calculates total consumption power of the thermal management system based on the heating power or cooling power of the thermal management system and the coolant flow rate. The required current of the thermal management system may be obtained by using a ratio of the total consumption power of the thermal management system to the current battery voltage. The current battery voltage corresponds to the current SOC of the battery. The heating power or the cooling power of the thermal management system may be obtained in step S3002. The thermal management system working mode request is determined based on a comparison between a current temperature of a to-be-charged device and a temperature threshold of the to-be-charged device. A plurality of groups of threshold parameters are obtained, where each group of threshold parameters includes the coolant temperature threshold and the coolant flow threshold, and each group of threshold parameters corresponds to a thermal management system working mode request.

A thermal management request is determined based on the thermal management system working mode request, where the thermal management request includes a group of threshold parameters corresponding to a thermal management system working mode in the thermal management system working mode request in the plurality of groups of threshold parameters.

The coolant temperature threshold and the coolant flow threshold are obtained based on the thermal management request.

Heating power or cooling power of the thermal management system is obtained based on a difference between a current coolant temperature and the coolant temperature threshold.

Optionally, the consumption power of the water pump is calculated based on the coolant flow threshold and the coolant flow.

Step S3004: Allocate a charging current of the battery, a distribution current of the thermal management system, and power of the battery and the thermal management system.

It should be noted that, in a charging process, a capability of the charging pile may be less than a maximum charging requirement of the battery. Therefore, the charging current Ibat_charge of the battery and the current Ithermal_charge of the thermal management system are distributed based on a current Imax of the charging pile, the required current Ibat_req of the battery, and the required current Ithermal_req of the thermal management system.

When Imax>Ibat_req+Ithermal_req, the charging current that can be provided to the battery is the required current of the battery Ibat_charge=Ibat_req. The distribution current that can be provided to the thermal management system is Ithermal_req. Power allocated to the thermal management system is V×(Ithermal_req), where V is the voltage of the battery. Power allocated to the battery is V×(Ibat_req).

When Imax<Ibat_req+Ithermal_req, the current allocated to the thermal management system is K×Imax, where K is a coefficient and 0<K≤1. A value of K depends on a current charging strategy of the battery, for example, whether the charging priority is heating priority or charging priority. The charging current of the battery is Imax×(1−K). The power allocated to the thermal management system is V×K×Imax, and the power allocated to the battery is V×Imax×(1−K).

It may be understood that working power of a heating loop component may be calculated based on the heating capacity and the distribution current allocated to the thermal management system. A calculation method is consistent with a control method in an actual thermal management controller, and may be PID control, fuzzy control, or the like, so as to better estimate a future charging behavior, and make the future charging behavior more consistent with the actual charging process.

It may be understood that working power of a cooling loop component may be calculated based on the cooling capacity and the distribution current allocated to the thermal management system. A calculation method is consistent with a control method in an actual thermal management controller, and may be PID control, fuzzy control, or the like, so as to better estimate a future charging behavior, and make the future charging behavior more consistent with the actual charging process.

It may be understood that working power of a temperature equalization component may be calculated based on the distribution current allocated to the thermal management system. A calculation method is consistent with a control method in an actual thermal management controller, and may be PID control, fuzzy control, or the like, so as to better estimate a future charging behavior, and make the future charging behavior more consistent with the actual charging process.

The obtained charging current of the battery and the distribution current of the thermal management system are output to step S3006 for calculating a remaining charging time.

Step S3005: Estimate a future coolant temperature.

The future coolant temperature is estimated based on the working power of each loop of the thermal management system. The coolant temperature is obtained based on a difference between the cooling capacity or heating capacity of the thermal management system and a heat exchanging capacity Qcool between the battery and the coolant. The cooling capacity or the heating capacity of the thermal management system may be obtained by using the working power allocated to each loop of the thermal management system in step S3004. The heat exchanging capacity Qcool between the battery and the coolant is equal to battery-coolant heat exchange coefficient×(battery temperature−coolant temperature). Based on the current of the charging pile, the ambient temperature, the coolant temperature, and the coolant flow rate, the battery-coolant heat exchanged coefficient is obtained through calculation by using the battery-coolant heat exchange model. The obtained coolant temperature is output to step S4000 for further estimation of the future battery temperature.

The following describes a charging time off-line estimation method provided in Embodiment 6 of this application.

This embodiment differs from Embodiment 6 in that this embodiment is the charging time off-line estimation method, and the method in this embodiment is based on a thermal management strategy optimization model. An optimized off-line BMS thermal management strategy can be obtained after the estimated charging time is obtained. The obtained off-line BMS thermal management strategy includes a battery temperature threshold, a coolant temperature, and a coolant flow rate that are requested by the thermal management. The off-line BMS thermal management strategy obtained in this embodiment may be used to estimate the thermal management system working mode in Embodiment 6.

In addition, in the charging time estimation method in this embodiment, in addition to outputting a charging time in a future charging process, other thermal management strategies may also be outputted, for example, energy consumption of the thermal management system in the future charging process (a required current and a distribution current of the thermal management system), a charging current and charging efficiency of a battery (battery current/(battery current+thermal management system current)), and charge temperature curve of the battery.

Figure 8:
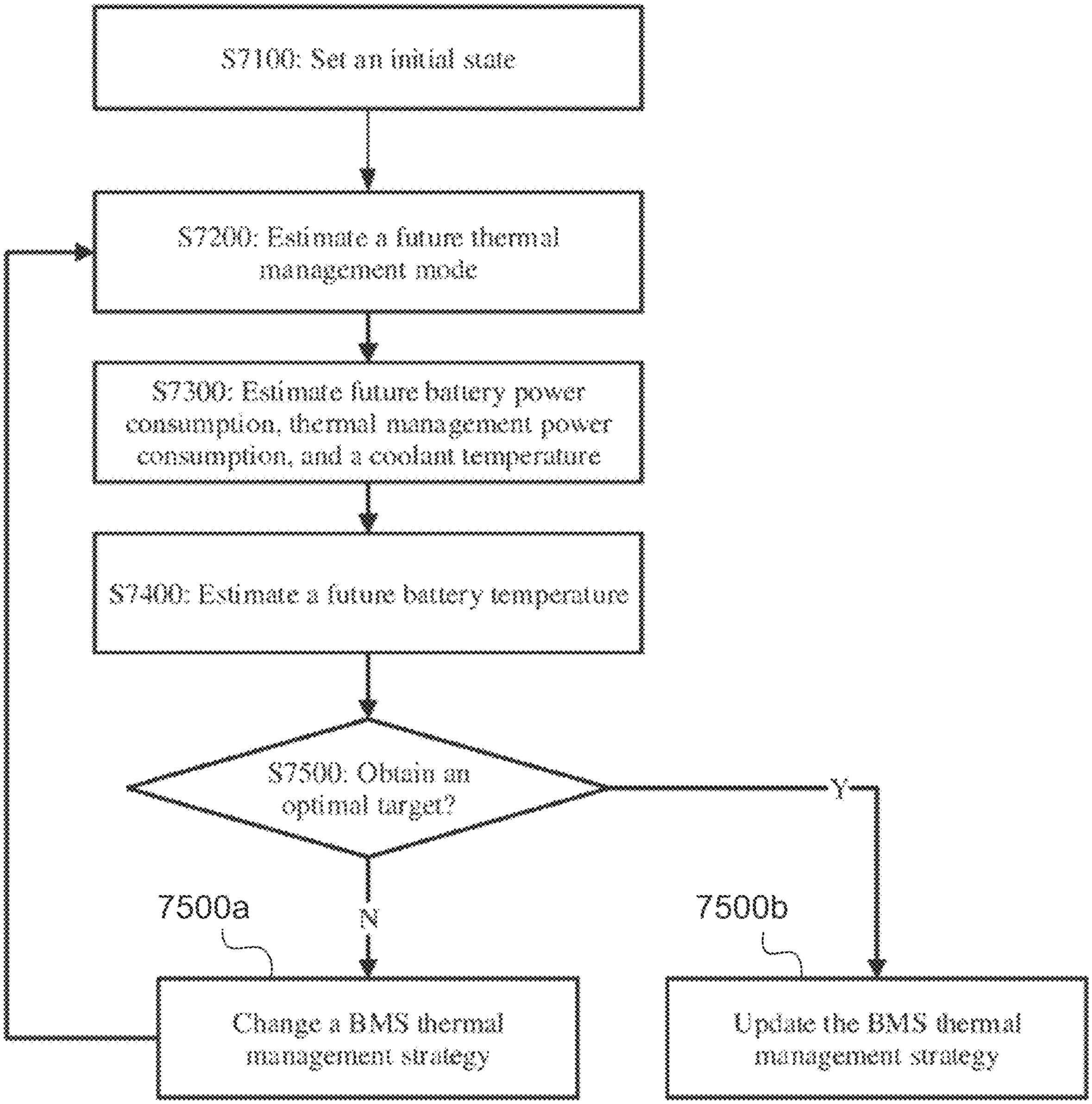
FIG. 8 is an example flowchart of an electric vehicle charging time off-line estimation method according to Embodiment 6 of this application.

FIG. 8 is a flowchart of a charging vehicle charging time off-line estimation method according to Embodiment 6 of this application. The charging vehicle charging time off-line estimation method includes: obtaining a plurality of groups of sample parameters, where each group of sample parameters includes a coolant sample temperature threshold and a coolant sample flow threshold, and each group of sample parameters corresponds to one thermal management system working mode request; obtaining charging times based on the plurality of groups of sample parameters; selecting a shortest charging time based on the obtained charging time; obtaining the thermal management request based on a sample temperature threshold of a to-be-charged device, the coolant sample temperature threshold, and the coolant sample flow threshold that correspond to the shortest charging time. The thermal management system working mode request includes a cooling request, a heating request, and a temperature equalization request. The charging device is a charging pile. The to-be-charged device is a battery. The method includes the following steps.

Step S7100: Set an initial sample state.

This phase is slightly different from step S1000 in Embodiment 6. This embodiment is used to optimize an off-line BMS thermal management strategy. Therefore, the initial sample state needs to be preset in advance, including an initial sample ambient temperature, an initial sample battery state (a sample temperature, a sample SOC, a sample SOH, a sample SOE, or the like), an initial sample coolant temperature, a sample charge termination condition (a sample termination SOC), a sample charge/discharge ratio, and a sample charging pile current. The BMS queries the table to obtain a required current of the battery based on the current temperature and SOC of the battery.

Optionally, setting the initial sample state may further include setting a sample vehicle state. In addition to fast charging, the sample vehicle state may further include slow charging and running. Different sample vehicle states correspond to different optimal targets. The BMS thermal management strategies are different based on different optimal objectives. When the sample vehicle state is fast charging, the optimal objective is the shortest charging time. When the sample vehicle state is slow charging, the optimal target is the highest charging efficiency. When the sample vehicle state is running, the optimal target is the maximum SOE that can be released by the battery. The battery temperature is controlled through the thermal management strategy, so that a difference between an increment of the battery SOE caused by the battery temperature and a power consumed by the thermal management system is maximized, so as to maximize the SOE that can be released by the battery.

Step S7200: Estimate a future thermal management system working mode.

This phase is different from steps in Embodiment 6. This embodiment is used to optimize the off-line BMS thermal management strategy. Therefore, different thermal management strategies need to be set based on sample parameters to finally obtain optimal thermal management strategies in different sample vehicle states. For example, the thermal management system is enabled or disabled at the most appropriate time to maximize battery capabilities while ensuring battery safety. For another example, an appropriate sample battery temperature threshold, a sample coolant flow threshold, and a sample coolant temperature threshold are selected to obtain the shortest charging time. The sample parameters include a battery sample temperature threshold, a coolant sample temperature threshold, and a coolant sample flow threshold. The battery sample temperature threshold includes a sample battery temperature threshold for starting a cooling loop, a sample battery temperature threshold for starting a heating loop, and a sample battery temperature threshold for starting a temperature equalization loop. The coolant sample temperature threshold includes a sample coolant temperature when cooling is requested, a sample coolant temperature when heating is requested, and a sample coolant temperature when temperature equalization is requested. The coolant sample flow threshold includes a sample coolant flow when heating is requested, a sample coolant flow when cooling is requested, and a sample coolant flow when temperature equalization is requested.

Optionally, the sample battery temperature threshold for starting the cooling loop is 25° C./30° C./35° C./40° C. The sample coolant temperature when cooling is requested is 10° C./15° C./20° C./25° C./30° C. The sample coolant flow when cooling is requested is 5/10/15/20/25/30 L/min. The sample battery temperature threshold for starting the heating loop is-5° C./0° C./10° C./15° C./20° C./25° C. The sample coolant temperature when heating is requested is 30° C./35° C./40° C./45° C./50° C./55° C./60° C. The sample coolant flow when heating is requested is 5/10/15/20/25/30 L/min.

Optionally, a specific size and a range of the foregoing sample parameters may be determined based on an actual requirement or historical experience, and are not limited to the foregoing specific values.

Step S7300: Estimate a future charging current of the battery, a distribution current of the thermal management system, and a coolant temperature.

This stage is similar to step S3000 in Embodiment 6. Based on an estimated thermal management system working state in a future charging process, a required current and a charging current of the battery in the future charging process, a required current and a distribution current of the thermal management system, and the coolant temperature are obtained.

Step S7400: Estimate a future battery temperature.

This phase is similar to step S4000 in Embodiment 6, the battery temperature in the future charging process is estimated based on the ambient temperature, the charging current of the battery, and the coolant temperature in the future charging process.

Step S7500: Determinate an optimal target

According to a BMS thermal management strategy corresponding to each group of sample parameters, all process states under this working condition can be obtained, including a battery temperature change, a temperature change of the coolant, the distribution current of the thermal management system in the future process, the charging current, charging efficiency and charging time of the battery in the future process, and an SOE of energy that can be released from the battery in the future. The SOE may be obtained by multiplying a working current, an output voltage, and a discharge time. An actual discharge current is a sum of the working current of the battery and a consumption current of the thermal management system. Different target values are obtained through different thermal management strategies. The set sample parameters are run to determine whether the obtained target value is the optimal target. If the obtained target value is the optimal target (7500*b*), the optimal BMS thermal management strategy is obtained based on the optimal target of each vehicle state. If the optimal target is not obtained (7500*a*), the sample parameters corresponding to the BMS thermal management strategy are changed until all the sample parameters in the sample are run. As described in step S7100, the optimal targets include the shortest charging time, the highest charging efficiency, and the maximum SOE of energy that can be released from the battery. In addition, the battery sample temperature threshold, the coolant sample temperature threshold, and the coolant sample flow threshold that are obtained in this embodiment may be used in the charging time estimation method in the foregoing embodiments, so as to reduce an experimental amount and improve estimation efficiency and accuracy.

The charging time off-line estimation method provided in Embodiment 6 of this application is obtained based on an optimization model of the BMS thermal management strategy, and the thermal management system working mode in the future working condition is considered in the model. Compared with a conventional online optimization algorithm or an off-line calibration algorithm based on a fixed coolant temperature and a flow rate, the method proposed in this embodiment of this application more accurately estimates an actual charging process of the battery through coupling with the BMS thermal management strategy in real time.

Figure 9:
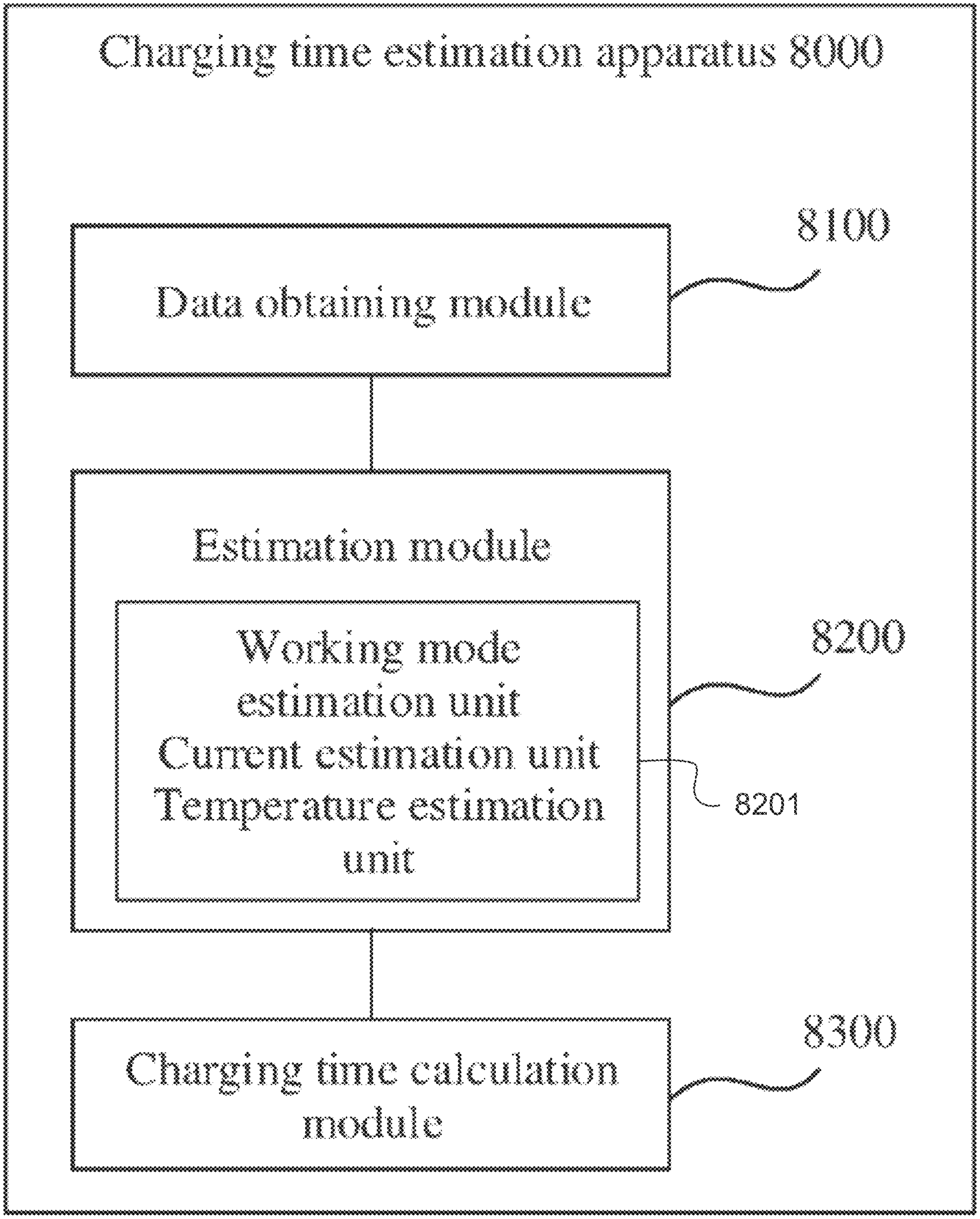
FIG. 9 is an example schematic diagram of a structure of a charging time estimation apparatus according to an embodiment of this application.

Based on the charging time estimation method described in the foregoing embodiments, Embodiment 7 of this application further provides a charging time estimation apparatus 8000. FIG. 9 is a schematic diagram of a structure of a charging time estimation apparatus 8000 according to an embodiment of this application. Refer to FIG. 9. The apparatus includes a data obtaining module 8100, an estimation module 8200, and a charging time calculation module 8300.

In an embodiment, the apparatus may be implemented by a proper combination of software, hardware, and/or firmware, for example, one or more software modules implemented by using a computer program. The software modules may be included in an operating system, or may be invoked by an operating system or an application as an independent component.

In another embodiment, the data obtaining module 8100, the estimation module 8200, and the charging time calculation module 8300 may also be processors, and functions of the data obtaining module 8100, the estimation module 8200, and the charging time calculation module 8300 can be implemented by the processor by executing a computer program (e.g., an instruction).

The data obtaining module 8100 is configured to perform step S101 in the embodiment in FIG. 4(*b*). The data obtaining module 8100 is configured to obtain a current temperature of the to-be-charged device and a current state of charge (SOC) of the to-be-charged device.

The estimation module 8200 is configured to perform steps S102 to S104 in the embodiment in FIG. 4(*b*). The estimation module 8200 is configured to estimate a required current of a thermal management system, a required current of the to-be-charged device, and a charging current of the to-be-charged device based on the current temperature of the to-be-charged device, the current state of charge of the to-be-charged device, and a charging device current.

The calculation module 8300 is configured to perform step S105 in the embodiment in FIG. 4(*b*). The calculation module 8300 is configured to calculate the charging time based on the charging current of the to-be-charged device.

The data obtaining module 8100 obtains a charging pile current, a current battery temperature, a current SOC, an ambient temperature, a current coolant temperature, and a charging end condition (a target SOC or a target SOE).

The estimation module 8200 may include units 8201, including a working mode estimation unit, a current estimation unit, and a temperature estimation unit. The working mode estimation unit is configured to estimate a thermal management system working mode. The current estimation unit estimates a distribution current of the thermal management system and a charging current of the charging pile based on the charging pile current, the required current of the thermal management system, and the required current of the battery. The temperature estimation unit is used to estimate the coolant temperature and the charging pile temperature. When the charging device current is less than a sum of the required current of the to-be-charged device and the required current of the thermal management system, the distribution current of the thermal management system is Kx the charging device current, and the charging current of the to-be-charged device is a difference between the charging device current and the distribution current of the thermal management system, that is, $(1-K)\times$ the charging device current, where K is a coefficient, and $0<K\leq 1$. Based on the determined charging current of the to-be-charged device, a heat generating capacity of the to-be-charged device is obtained, a heat exchanging capacity between the to-be-charged device and the coolant is obtained, and a heat exchanging capacity between the to-be-charged device and an environment is obtained. A current temperature of the to-be-charged device is obtained based on a sum of the heat generating capacity of the to-be-charged device, the heat exchanging capacity between the to-be-charged device and the coolant, and the heat exchanging capacity between the to-be-charged device and the environment. Obtaining the required current of the thermal management system includes: determining a thermal management system working mode request by a comparing the current temperature of the to-be-charged device with a temperature threshold of the to-be-charged device; obtaining a plurality of groups of threshold parameters, where each group of threshold parameters includes a coolant temperature threshold and a coolant flow threshold, and each group of threshold parameters corresponds to a thermal management system working mode request; and determining a thermal management request based on the thermal management system working mode request, where the thermal management request includes a group of threshold parameters corresponding to the thermal management system working mode in the thermal management system working mode request in the plurality of groups of threshold parameters.

The coolant temperature threshold and the coolant flow threshold are obtained based on the thermal management request.

Heating power or cooling power of the thermal management system is obtained based on a difference between a current coolant temperature and the coolant temperature threshold.

Consumption power of a water pump is obtained based on a current coolant flow and the coolant flow threshold.

The required current of the thermal management system is obtained based on the heating power or the cooling power and the consumption power of the water pump.

The current estimation unit further includes a cooling loop power estimation unit, a heating loop power estimation unit, and a temperature equalization loop power estimation unit, which are used to estimate energy consumption of each loop of the thermal management system. Based on a thermal management system working mode request and a coolant temperature and flow rate request that are included in a thermal management request sent by a BMS, after receiving the BMS request, a TMS model simulated in the BMS determines that the thermal management system working mode in the future charging process is heating, cooling, and temperature equalization. If the charging pile needs heating, a heating loop power calculation unit in the TMS model simulated in the BMS is triggered. If the charging pile needs cooling, a cooling loop power calculation unit in the TMS model simulated in the BMS is triggered. If the charging pile requires temperature equalization, a charging pile temperature equalization loop power calculation unit in the TMS model simulated in the BMS is triggered.

The charging time calculation module 8300 calculates, based on the charging current of the battery obtained from the estimation module, a time required from a current moment to the end of charging.

The charging device is a charging pile; and the to-be-charged device is a battery.

Optionally, the charging time estimation apparatus may further include a communications module, configured to display charging time information by using an HMI by using a communications module.

In addition, functional modules or units in the embodiments of this application may be integrated into one processing module or unit, or each of the modules or units may exist alone physically, or two or more modules or units are integrated into one module or unit.

The following describes a computer device provided in an embodiment of this application.

Figure 10:
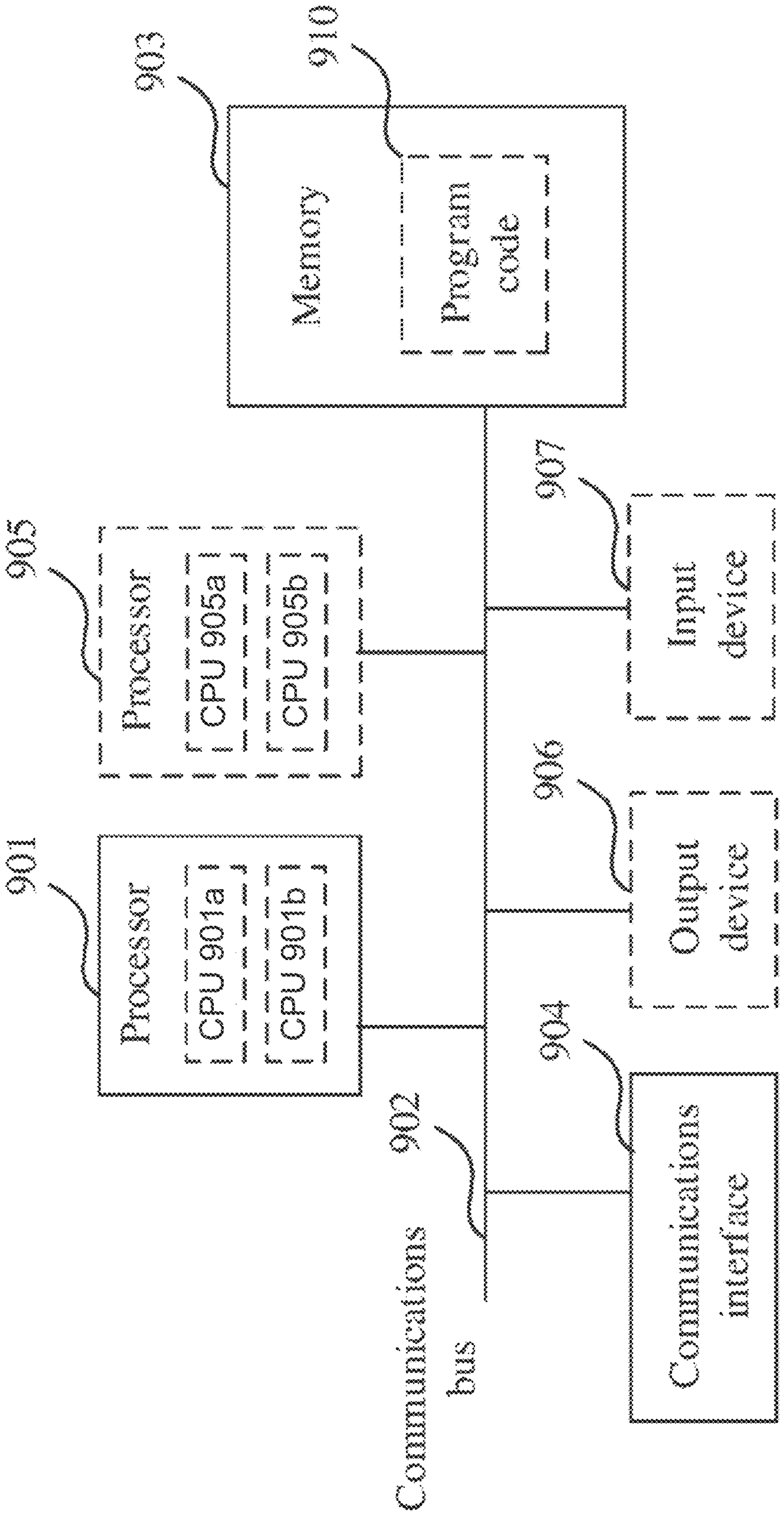
FIG. 10 is an example schematic diagram of a structure of a computer device according to an embodiment of this application.

FIG. 10 is a schematic diagram of a structure of a computer device according to an embodiment of this application. The apparatus architecture shown in FIG. 10 may be implemented by using the computer device. Refer to FIG. 10. The computer device includes at least one processor 901, a communications bus 902, a memory 903, and at least one communications interface 904.

The processor 901 may be a general-purpose central processing unit (CPU), a microprocessor, or an application-specific integrated circuit (ASIC), or may be one or more integrated circuits configured to control program execution in the solutions of this application.

The communications bus 902 may include a channel, used to transmit information between the foregoing components.

The memory 903 may be a read-only memory (ROM) or another type of static storage device that can store static information and instructions, or may be a random access memory (RAM) or another type of dynamic storage device that can store information and instructions, or may be an electrically erasable programmable read-only memory (EE-PROM), a compact disc read-only memory (CD-ROM) or another optical disk storage, an optical disc storage (including a compact disc, a laser disc, an optical disc, a digital versatile disc, a Blu-ray disc, and the like), or a disk storage medium or another magnetic storage device, or any other medium capable of carrying or storing desired program code in a form of instructions or a data structure and capable of being accessed by a computer. This application not limited thereto. The memory 903 may exist independently, and is connected to the processor 901 through the communications bus 902. The memory 903 may also be integrated with the processor 901.

The communications interface 904 is configured to communicate with another device or a communications network, such as an Ethernet, a radio access network (RAN), or a wireless local area network (WLAN), by using any apparatus such as a transceiver.

In a specific implementation, in an embodiment, the processor 901 may include one or more CPUs, for example, a CPU 901*a* and a CPU 901*b* in FIG. 9. The processor 905 may also include one or more CPUs, for example, a CPU 905*a* and a CPU 905*b* in FIG. 9.

In a specific implementation, in an embodiment, the computer device may include a plurality of processors, for example, the processor 901 and a processor 905 shown in FIG. 9. Each of the processors may be a single-core processor (single-CPU) or may be a multi-core processor (multi-CPU). The processor herein may refer to one or more devices, circuits, and/or processing cores configured to process data (such as computer program instructions).

In specific implementation, in an embodiment, the computer device further includes an output device 906 and an input device 907. The output device 906 communicates with the processor 901 and may display information in various manners. For example, the output device 906 may be a liquid crystal display (LCD), a light emitting diode (LED) display device, a cathode ray tube (CRT) display device, or a projector. The input device 907 communicates with the processor 901, and may receive input of a user in a plurality of manners. For example, the input device 907 may be a mouse, a keyboard, a touchscreen device, a sensing device, or the like.

The foregoing computer device may be a general-purpose computer device or a dedicated computer device. In specific implementation, the computer device may be a desktop computer, a portable computer, a network server, a personal digital assistant (PDA), a mobile phone, a tablet, a wireless terminal device, a communications device, or an embedded device. The computer device may be disposed on an electric vehicle or a charging pile. A type of the computer device is not limited in this embodiment of this application.

The memory 903 is configured to store program code 910 for executing the solutions of this application, and the processor 901 is configured to execute the program code 910 stored in the memory 903. The computer device may implement, by using the processor 901 and the program code 910 in the memory 903, the charging time estimation method provided in the embodiments in FIG. 3 to FIG. 8.

All or some of the foregoing embodiments may be implemented by using software, hardware, firmware, or any combination thereof. When software is used to implement the embodiments, all or some of the embodiments may be implemented in a form of a computer program product. The computer program product includes one or more computer instructions. When the computer instructions are loaded and executed on a computer, the procedures or functions according to embodiments of this application are all or partially generated. The computer may be a general-purpose computer, a dedicated computer, a computer network, or another programmable apparatus. The computer instructions may be stored in a computer-readable storage medium or may be transmitted from a computer-readable storage medium to another computer-readable storage medium. For example, the computer instructions may be transmitted from a website, computer, server, or data center to another website, computer, server, or data center in a wired (for example, a coaxial cable, an optical fiber, or a digital subscriber line (DSL)) or wireless (for example, infrared, radio, or microwave) manner. The computer-readable storage medium may be any usable medium accessible by a computer, or a data storage device, such as a server or a data center, integrating one or more usable media. The usable medium may be a magnetic medium (for example, a floppy disk, a hard disk, or a magnetic tape), an optical medium (for example, a digital versatile disc (DVD), a semiconductor medium (for example, a solid-state drive (SSD)), or the like.

In the embodiments provided in this application, it should be understood that the charging time estimation method, apparatus, and storage medium may also be used in a discharging time estimation method, apparatus, and storage medium. In a charging process, the output current of the charging pile is a sum of a required current of a battery and a required current of a thermal management system. In the discharge process, an actual discharge current of the battery is a sum of a discharge working condition current and a consumption current of the thermal management system.

In the embodiments provided in this application, it should be understood that the disclosed apparatus and method may be implemented in other manners. For example, the described apparatus embodiment is merely an example. For example, the unit division is merely logical function division and may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in an electrical form, a mechanical form, or another form.

The foregoing descriptions are merely embodiments of this application, but are not intended to limit this application. Any modification, equivalent replacement, or improvement made without departing from the spirit and principle of this application should fall within the protection scope of this application.

What is claimed is:

1. A charging system, comprising:

a to-be-charged device;

a thermal management system configured to provide thermal management for the to-be-charged device;

a charging device configured to charge the to-be-charged device and to provide current to the thermal management system; and a to-be-charged device management system configured to:

obtain a current temperature and a current state of charge (SOC) of the to-be-charged device;

obtain a required current of the to-be-charged device based on the current temperature and the current SOC;

determine whether a charging device current of the charging device is greater than or equal to a sum of the required current of the to-be-charged device and a required current of the thermal management system;

based on the charging device current of the charging device being less than the sum of the required current of the to-be-charged device and the required current of the thermal management system, determine a charging current of the to-be-charged device, wherein the determined charging current of the to-be-charged device is less than the obtained required current of the to-be-charged device; and estimate a charging time for the to-be-charged device based on the determined charging current of the to-be-charged device and the current SOC of the to-be-charged device.

2. The system according to claim 1, wherein the charging current of the to-be-charged device is determined to be a difference between the charging device current and a distribution current of the thermal management system.

3. The system according to claim 1, wherein obtaining the current temperature of the to-be-charged device comprises:

obtaining a temperature of the to-be-charged device determined in a previous calculation period, wherein determining the temperature of the to-be-charged device in the previous calculation period comprises:

obtaining a heat generating capacity of the to-be-charged device, obtaining a heat exchanging capacity between the to-be-charged device and a coolant, obtaining a heat exchanging capacity between the to-be-charged device and an environment, and obtaining the temperature of the to-be-charged device based on a sum of the heat generating capacity of the to-be-charged device, the heat exchanging capacity between the to-be-charged device and the coolant, and the heat exchanging capacity between the to-be-charged device and the environment.

4. The system according to claim 3, wherein obtaining the heat generating capacity of the to-be-charged device comprises:

obtaining the heat generating capacity of the to-be-charged device based on the charging current of the to-be-charged device and a heat generation internal resistance of the to-be-charged device.

5. The system according to claim 3, wherein obtaining the heat exchanging capacity between the to-be-charged device and the environment comprises:

obtaining the heat exchanging capacity between the to-be-charged device and the environment based on a temperature difference between a respective temperature of the to-be-charged device and a respective ambient temperature.

6. The system according to claim 3, wherein obtaining the heat exchanging capacity between the to-be-charged device and the coolant comprises:

obtaining a coolant temperature, and obtaining the heat exchanging capacity between the to-be-charged device and the coolant based on a temperature difference between a respective temperature of the to-be-charged device and the coolant temperature.

7. The system according to claim 1, wherein the to-be-charged device management system is further configured to:

obtain the required current of the thermal management system.

8. The system according to claim 7, wherein obtaining the required current of the thermal management system comprises:

determining a thermal management system working mode request based on a comparison between the current temperature of the to-be-charged device and a temperature threshold of the to-be-charged device;

obtaining a plurality of groups of threshold parameters, wherein each group of threshold parameters comprises a coolant temperature threshold and a coolant flow threshold, and each group of threshold parameters corresponds to a respective thermal management system working mode request;

determining a thermal management request based on the thermal management system working mode request, wherein the thermal management request comprises a group of threshold parameters corresponding to a thermal management system working mode in the thermal management system working mode request in the plurality of groups of threshold parameters;

obtaining the coolant temperature threshold and the coolant flow threshold based on the thermal management request;

obtaining heating power or cooling power of the thermal management system based on a difference between a current coolant temperature and the coolant temperature threshold;

obtaining consumption power of a water pump based on a current coolant flow and the coolant flow threshold; and obtaining the required current of the thermal management system based on the heating power or the cooling power and the consumption power of the water pump.

9. The system according to claim 8, wherein obtaining the thermal management request comprises:

obtaining a plurality of groups of sample parameters, wherein each group of sample parameters comprises a coolant sample temperature threshold and a coolant sample flow threshold, and each group of sample parameters corresponds to a respective thermal management system working mode request;

obtaining charging times based on the plurality of groups of sample parameters;

selecting a shortest charging time based on the obtained charging times; and obtaining the thermal management request based on a sample temperature threshold of the to-be-charged device, the coolant sample temperature threshold, and the coolant sample flow threshold that correspond to the shortest charging time.

10. The system according to claim 8, wherein the thermal management system working mode request comprises a cooling request, a heating request, or a temperature equalization request.

11. The system according to claim 1, wherein the charging device is a charging pile.

12. The system according to claim 1, wherein the to-be-charged device is a battery.

13. A charging time estimation apparatus, comprising:

a processor; and a non-transitory memory configured to store computer readable instructions;

wherein the processor is configured to execute the instructions to cause the charging time estimation apparatus to:

obtain a current temperature and a current state of charge (SOC) of a to-be-charged device;

obtain a required current of the to-be-charged device based on the current temperature and the current SOC determine whether a charging device current of a charging device is greater than or equal to a sum of the required current of the to-be-charged device and a required current of a thermal management system;

based on the charging device current of the charging device being less than the sum of the required current of the to-be-charged device and the required current of the thermal management system, determine a charging current of the to-be-charged device, wherein the determined charging current of the to-be-charged device is less than the obtained required current of the to-be-charged device; and estimate a charging time for the to-be-charged device based on the determined charging current of the to-be-charged device and the current SOC of the to-be-charged device.

14. The apparatus according to claim 13, wherein the charging current of the to-be-charged device is determined to be a difference between the charging device current and a distribution current of the thermal management system.

15. The apparatus according to claim 13, wherein the processor is further configured to execute the instructions to cause the apparatus to:

obtain a heat generating capacity of the to-be-charged device, obtain a heat exchanging capacity between the to-be-charged device and a coolant, obtain a heat exchanging capacity between the to-be-charged device and an environment, and obtain the current temperature of the to-be-charged device based on a sum of the heat generating capacity of the to-be-charged device, the heat exchanging capacity between the to-be-charged device and the coolant, and the heat exchanging capacity between the to-be-charged device and the environment.

16. The apparatus according to claim 13, wherein the processor is further configured to execute the instructions to cause the apparatus to:

determine a thermal management system working mode request based on a comparison between the current temperature of the to-be-charged device and a temperature threshold of the to-be-charged device;

obtain a plurality of groups of threshold parameters, wherein each group of threshold parameters comprises a coolant temperature threshold and a coolant flow threshold, and each group of threshold parameters corresponds to a respective thermal management system working mode request;

determine a thermal management request based on the thermal management system working mode request, wherein the thermal management request comprises a group of threshold parameters corresponding to a thermal management system working mode in the thermal management system working mode request in the plurality of groups of threshold parameters;

obtain the coolant temperature threshold and the coolant flow threshold based on the thermal management request;

obtain heating power or cooling power of the thermal management system based on a difference between a current coolant temperature and the coolant temperature threshold;

obtain consumption power of a water pump based on a current coolant flow and the coolant flow threshold; and obtain the required current of the thermal management system based on the heating power or the cooling power and the consumption power of the water pump.

17. The apparatus according to claim 13, wherein the charging device is a charging pile.

18. The apparatus according to claim 13, wherein the to-be-charged device is a battery.

19. The apparatus according to claim 15, wherein obtaining the heat generating capacity of the to-be-charged device comprises:

obtaining the heat generating capacity of the to-be-charged device based on the charging current of the to-be-charged device and a heat generation internal resistance of the to-be-charged device.

20. The apparatus according to claim 15, wherein obtaining the heat exchanging capacity between the to-be-charged device and the environment comprises:

obtaining the heat exchanging capacity between the to-be-charged device and the environment based on a temperature difference between a respective temperature of the to-be-charged device and a respective ambient temperature.

* * * * *